(12) United States Patent
Haji et al.

(10) Patent No.: US 7,033,842 B2
(45) Date of Patent: Apr. 25, 2006

(54) ELECTRONIC COMPONENT MOUNTING APPARATUS AND ELECTRONIC COMPONENT MOUNTING METHOD

(75) Inventors: Hiroshi Haji, Chikushino (JP); Toshiro Hirakawa, Saga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 131 days.

(21) Appl. No.: 10/394,982

(22) Filed: Mar. 21, 2003

(65) Prior Publication Data

US 2003/0177633 A1 Sep. 25, 2003

(30) Foreign Application Priority Data

| Mar. 25, 2002 | (JP) | .......................... P 2002-082648 |
| Mar. 27, 2002 | (JP) | .......................... P 2002-087870 |
| Mar. 27, 2002 | (JP) | .......................... P 2002-087871 |

(51) Int. Cl.
*H01L 21/60* (2006.01)
*H01L 21/67* (2006.01)

(52) U.S. Cl. ........................................... 438/6; 228/19
(58) Field of Classification Search .................. 438/6; 228/19
See application file for complete search history.

(56) References Cited

U.S. PATENT DOCUMENTS

| 5,695,667 | A | * | 12/1997 | Eguchi et al. .............. 219/388 |
| 5,839,187 | A |   | 11/1998 | Sato et al. |
| 5,840,594 | A |   | 11/1998 | Tsubouchi et al. |
| 5,872,051 | A | * | 2/1999  | Fallon et al. ............... 438/616 |
| 6,759,738 | B1 | * | 7/2004 | Fallon et al. ............... 257/690 |
| 6,789,720 | B1 | * | 9/2004 | Uchida et al. ................ 228/22 |
| 2003/0110610 | A1 | * | 6/2003 | Duquette et al. ......... 29/407.09 |

FOREIGN PATENT DOCUMENTS

| JP | 02-31431    |   | 2/1990 |
| JP | 08-037209   | * | 2/1996 |
| JP | 09-008172   | * | 1/1997 |
| JP | 09-129658   |   | 5/1997 |
| JP | 10-022347   |   | 1/1998 |
| JP | 11-233713   |   | 8/1999 |
| JP | 2000-124264 |   | 4/2000 |
| JP | 2000100874  | * | 4/2000 |

* cited by examiner

*Primary Examiner*—W. David Coleman
(74) *Attorney, Agent, or Firm*—Pearne & Gordon LLP

(57) ABSTRACT

The present invention provides an electronic component mounting apparatus, wherein a high speed operation can be provided by simplifying the structure of a mounting head and wherein the working efficiency can be improved by eliminating the use of the mounting head for a coating process. In the electronic component mounting apparatus, a flux is coated on chips supplied to an electronic component feeding unit while bump formation faces are directed upward. The chips are mounted on a substrate. A holding head receives the chips extracted from an adhesive sheet by a mounting head and is inverted relative to a stage on which a flux is spread. As a result, the bumps of the chips are covered with the flux and are flattened, and after the holding head is returned to the original stage, the chips on the stage are extracted and mounted on the substrate by the mounting head.

20 Claims, 26 Drawing Sheets

ELECTRONIC COMPONENT MOUNTING APPARATUS AND ELECTRONIC COMPONENT MOUNTING METHOD

BACKGROUND OF THE INVENTION

1. Field of the Invention

The present invention relates to an electronic component mounting apparatus for mounting electronic components on a substrate, and to an electronic component mounting method.

2. Description of the Related Art

When in use, an electronic component mounting apparatus repetitively performs a mounting operation, wherefor a mounting head is employed, to securely mount on a substrate electronic components supplied by an electronic component feeding unit. Of the electronic components thus supplied, an electronic component such as a flip chip, on the surface of which are formed bumps, projecting electrodes used for connections, is generally fed with the bump formation surface facing upward.

Such an electronic component is extracted from the electronic component feeding unit by a special pickup device, for which an inversion mechanism is provided, and is inverted and is held with the bumps directed downwards. The mounting head, for mounting the electronic component on the substrate, receives the electronic component in the inverted state, and at a flux transfer stage performs an operation whereby a flux is transferred and applied to the bumps. Then, the mounting head is moved to the substrate, whereon the electronic component is thereafter mounted.

A conventional electronic component mounting apparatus is so designed that a mounting head for mounting an electronic component on a substrate also serves as a work head for performing a flux transfer operation. And since during a flux transfer operation a flattening operation is also frequently performed to shape the bumps on an electronic component, by pressing the lower ends of the bumps against a flat face, the mounting head also requires a mechanism for performing the flattening process. Therefore, since the strength of the mounting head must be increased to withstand the strain imposed by the application of pressure, the degree to which the structure of the mounting head can be simplified, and its weight reduced, is limited, and an increase in the speed of the mounting operation is precluded.

Further, even for a case wherein the flattening process is not required, the flux transfer operation and the mounting operation are supposed to be sequentially preformed by the same mounting head. Therefore, the tact time from when the electronic component is extracted until it is mounted on the substrate is delayed, and improving the overall working efficiency is difficult.

SUMMARY OF THE INVENTION

It is, therefore, one objective of the present invention to provide an electronic component mounting apparatus that, by eliminating the use of a mounting head for an operation for applying a viscous material, can improve the working efficiency, and an electronic component mounting method therefor.

According to a first aspect of the invention, an electronic component mounting apparatus, for applying viscous liquid to multiple projecting electrodes, which are formed on a projecting electrode formation face of an electronic component, and for mounting the electronic component on a work, comprises:

a viscous liquid supply unit, for supplying the viscous liquid that is spread out and evenly distributed during a flattening stage;

an arrangement unit for arranging the electronic component on the evenly distributed viscous liquid while the projecting electrodes continue to contact the viscous liquid;

a mounting unit, having a mounting head that includes a mounting nozzle, used for the vacuum chucking of the electronic component, for extracting the electronic component arranged on the viscous liquid using the mounting nozzle, and for mounting the electronic component on a work;

an electronic component recognition unit, having a camera for obtaining images of the electronic component held by the mounting nozzle, for employing an image obtained by the camera to identify the location of the electronic component; and a mounting controller for controlling the mounting unit based on the recognition results obtained by the electronic component recognition unit, and for positioning, on the work, the electronic component held by the mounting nozzle.

According to a second aspect of the invention, the electronic component mounting apparatus of the first aspect further comprises:

a squeegee for spreading out and leveling the viscous liquid on the stage.

According to a third aspect of the invention, for the electronic component mounting apparatus of the first or the second aspect, the arrangement unit includes:

a holding head for holding the electronic component, from the reverse face thereof, while the projecting electrode formation face is directed upward, wherein the holding head is vertically inverted relative to the stage, and the electronic component held by the holding head is placed on the viscous liquid.

According to a fourth aspect of the invention, the electronic component mounting apparatus of the third aspect further comprises:

an electronic component feeding unit for feeding the electronic component, with the projecting electrode formation face directed upward, wherein, by using the mounting nozzle of the mounting head, the electronic component is acquired from the electronic component feeding unit and is transmitted to the holding head.

According to a fifth aspect of the invention, the electronic component mounting apparatus of the third aspect further comprises:

an electronic component feeding unit for feeding an electronic component with the projecting electrode formation face directed upward; and a pickup unit for employing a pickup nozzle for a pickup head to acquire the electronic component from the electronic component feeding unit, and for transmitting the electronic component to the holding head.

According to a sixth aspect of the invention, the electronic component mounting apparatus of the first aspect further comprises:

an electronic component feeding unit for feeding an electronic component with the projecting electrode formation face directed downward, wherein the arrangement unit includes a pickup head for acquiring the electronic component from the electronic component feeding unit by vacuum chucking the reverse face of the electronic component using a pickup nozzle, and for placing the electronic component on the viscous liquid.

According to a seventh aspect of the invention, an electronic component mounting method, for applying viscous liquid to multiple projecting electrodes formed on a projecting electrode formation face of an electronic component, and for mounting the electronic component on a work, comprises:

a liquid level evening step of spreading out and leveling the viscous liquid on a flat stage;

an arrangement step of arranging the electronic component on the viscous liquid having an even liquid level, while the projecting electrodes contact the viscous liquid;

an extraction step of separating the electronic component from the viscous liquid by vacuum chucking using the mounting nozzle of the mounting head;

a component recognition step of using a camera to obtain images of the electronic component held by the mounting nozzle, and of employing the obtained image to identify the location of the electronic component; and a mounting step, based on the recognition results obtained at the component recognition step, of moving the mounting head in order to position the electronic component on a work, and of mounting the electronic component on the work.

According to an eighth aspect of the invention, for the electronic component mounting method of the seventh aspect, at the liquid level evening step, the viscous liquid is spread out and leveled on the stage using a squeegee.

According to a ninth aspect of the invention, for the electronic component mounting method of the seventh aspect, at the arrangement step, the holding head by which the reverse face of the electronic component is vacuum-chucked while the projecting electrode formation face is directed upward, is vertically inverted relative to the stage, so that the electronic component held by the holding head can be placed on the viscous liquid having the even liquid level.

According to a tenth aspect of the invention, the electronic component mounting method for the ninth aspect further comprises:

a step of using the mounting head to acquire and move the electronic component from the electronic component feeding unit, which feeds the electronic component with the projecting electrode formation face directed upward, and of transferring the electronic component to the holding head.

According to an eleventh aspect of the invention, the electronic component mounting method of the ninth aspect comprises:

a step of using a pickup nozzle of a pickup head to pick up and move the electronic component from the electronic component feeding unit, which feeds the electronic component with the projecting electrode formation face directed upward, and of transferring the electronic component to the holding head.

According to a twelfth aspect of the invention, for the electronic component mounting method of the seventh aspect, at the arrangement step, while the reverse face of the electronic component is vacuum-chucked by the pickup head, the electronic component is separated from the electronic component feeding unit that feeds the electronic component with the projecting electrode formation face directed downward. Then, the electronic component held by the pickup head is placed on the viscous liquid having the even liquid level.

According to the present invention, since the electronic component acquired from the electronic component feeding unit is placed on the viscous liquid that is spread out on a flat stage, the coating of the bumps with the viscous liquid is completed, and the electronic component is removed from the viscous liquid by using the mounting head and is mounted on the work. Therefore, the process whereby the mounting head is used to apply the viscous liquid can be eliminated, and the efficiency with which the work is performed can be improved.

Figure 1:
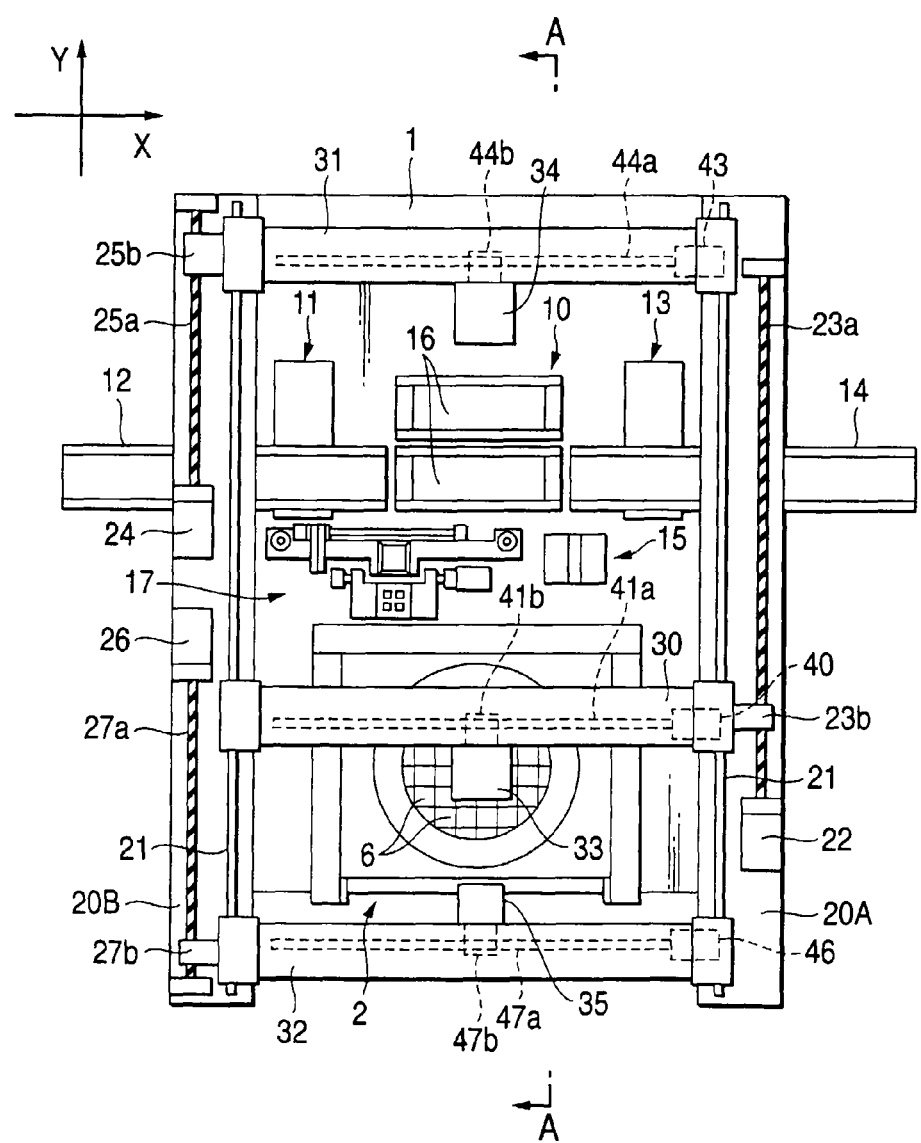
FIG. 1 is a plan view of an electronic component mounting apparatus according to a first embodiment of the present invention.

In the drawings, the reference numeral 2 refers to an electronic component feeding unit; 6 to a chip; 10 to a substrate holder; 10A to a first substrate holding mechanism; 10B to a second substrate holding mechanism; 15 to a third camera; 16 to a substrate; 16a to an electronic component mounting position; 17 to an inversion unit; 30 to a center beam; 31 to a first beam; 32 to a second beam; 33 to a mounting head; 33a to a nozzle; 34 to a first camera; 35 to a second camera; 36 to a pickup head; 36a to a nozzle; 54d to a pickup controller; 54e to a mounting controller; 55 to a first recognition processor; 56 to a second recognition processor; 57 to a third recognition processor; 74 to a holding head; 74a to a chip holder; 80 to a flux; and 83 to a squeegee unit.

DETAILED DESCRIPTION OF THE PREFERRED EMBODIMENTS (First Embodiment)

Figure 2:
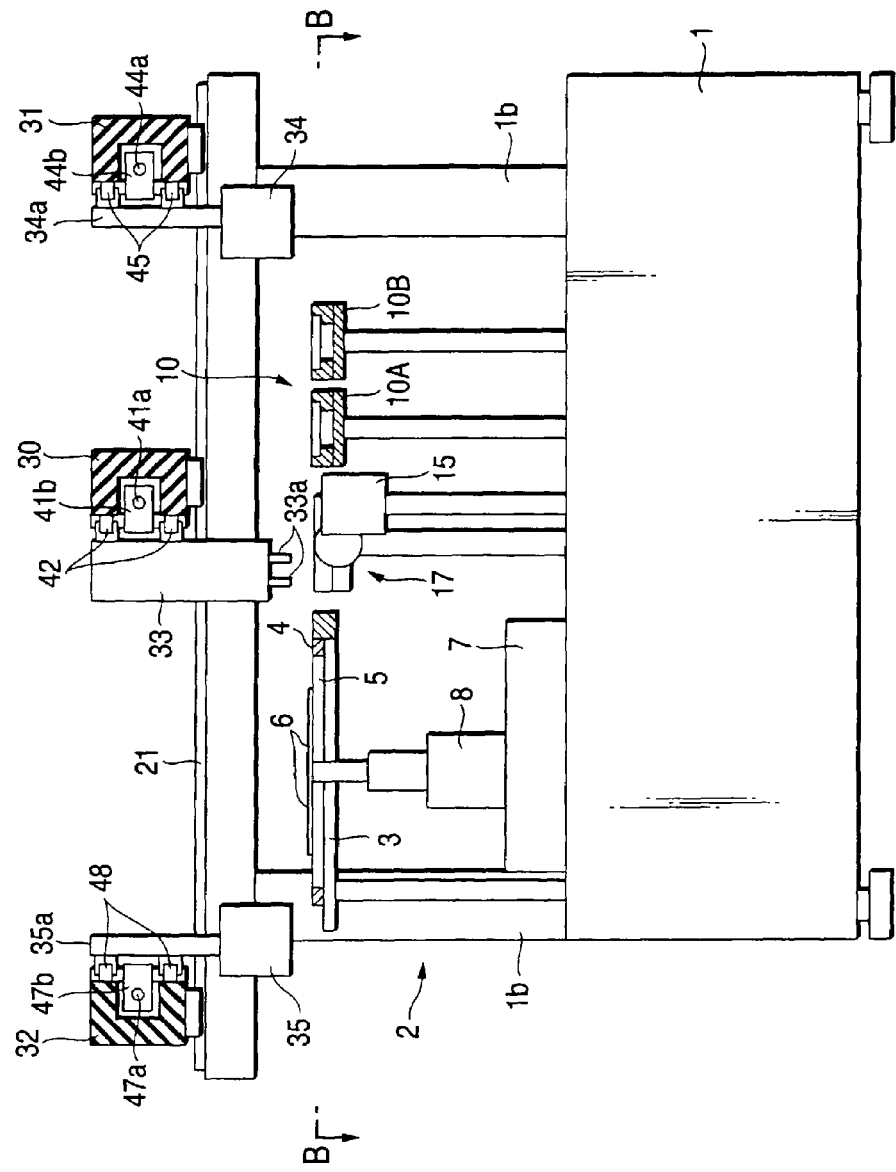
FIG. 2 is a side cross-sectional view of the electronic component mounting apparatus according to the first embodiment of the invention.
Figure 3:
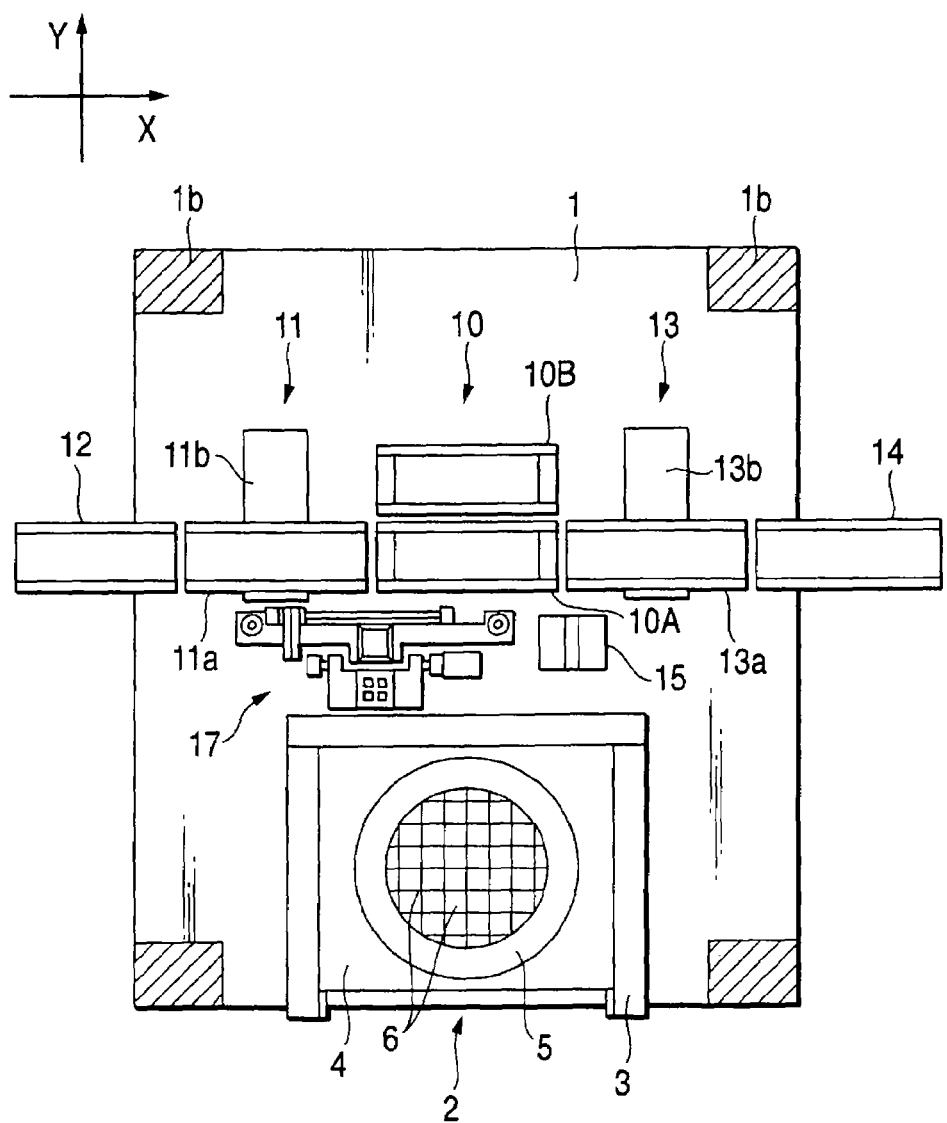
FIG. 3 is a side cross-sectional view of the electronic component mounting apparatus according to the first embodiment of the invention.
Figure 4:
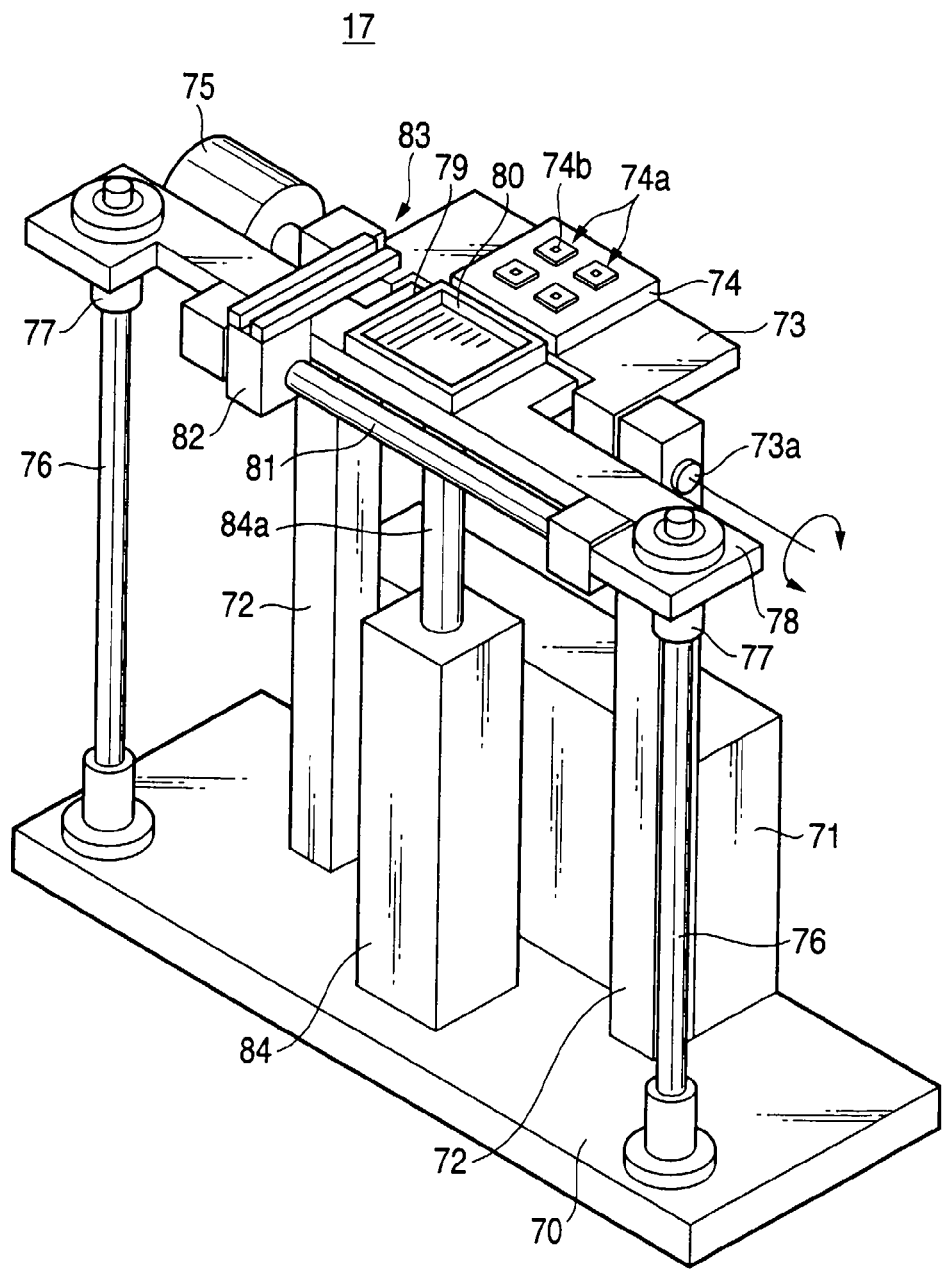
FIG. 4 is a perspective view of the inversion unit of the electronic component mounting apparatus according to the first embodiment of the invention.
Figure 7:
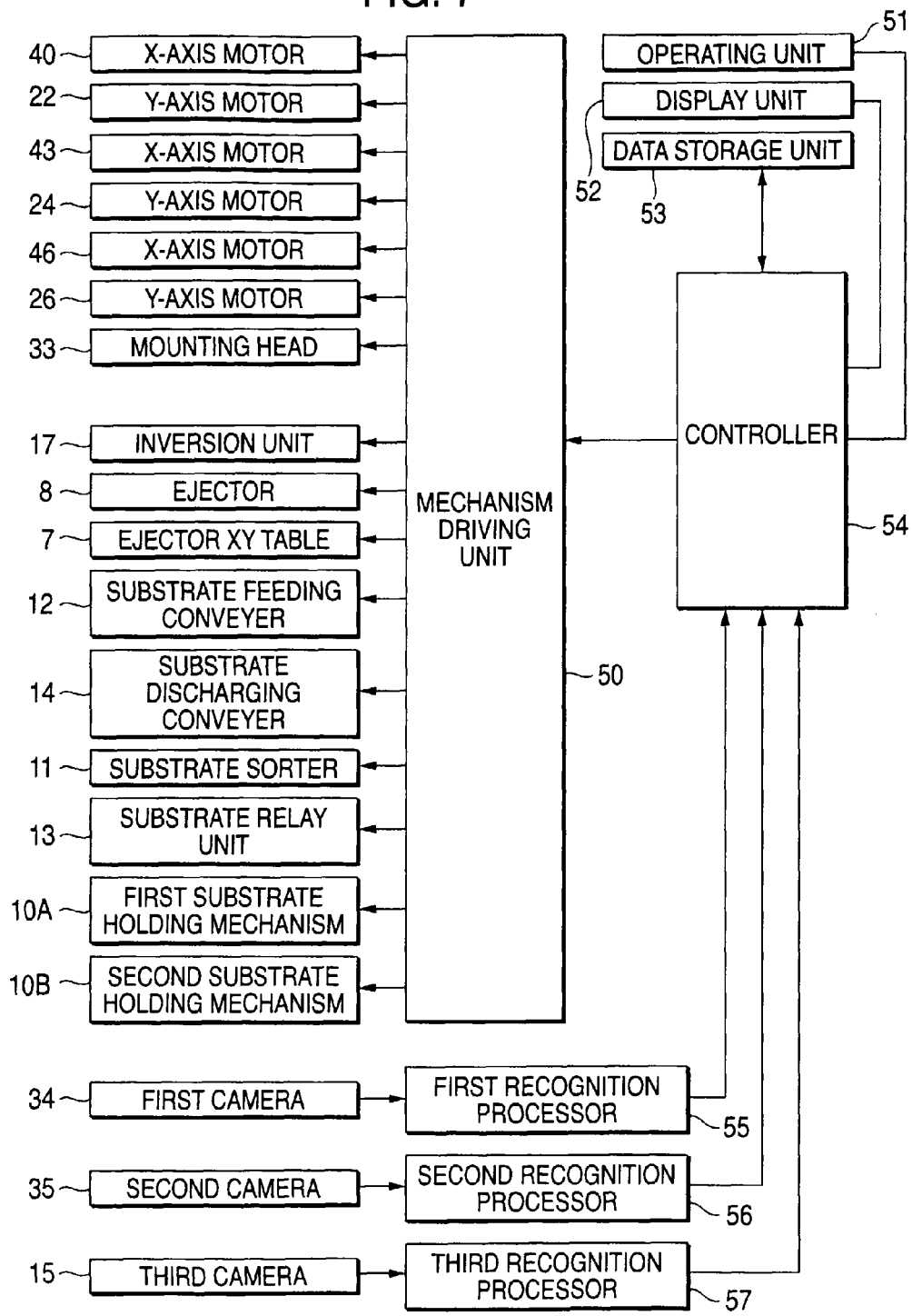
FIG. 7 is a block diagram showing the configuration of the control system of the electronic component mounting apparatus according to the first embodiment of the invention.
Figure 8:
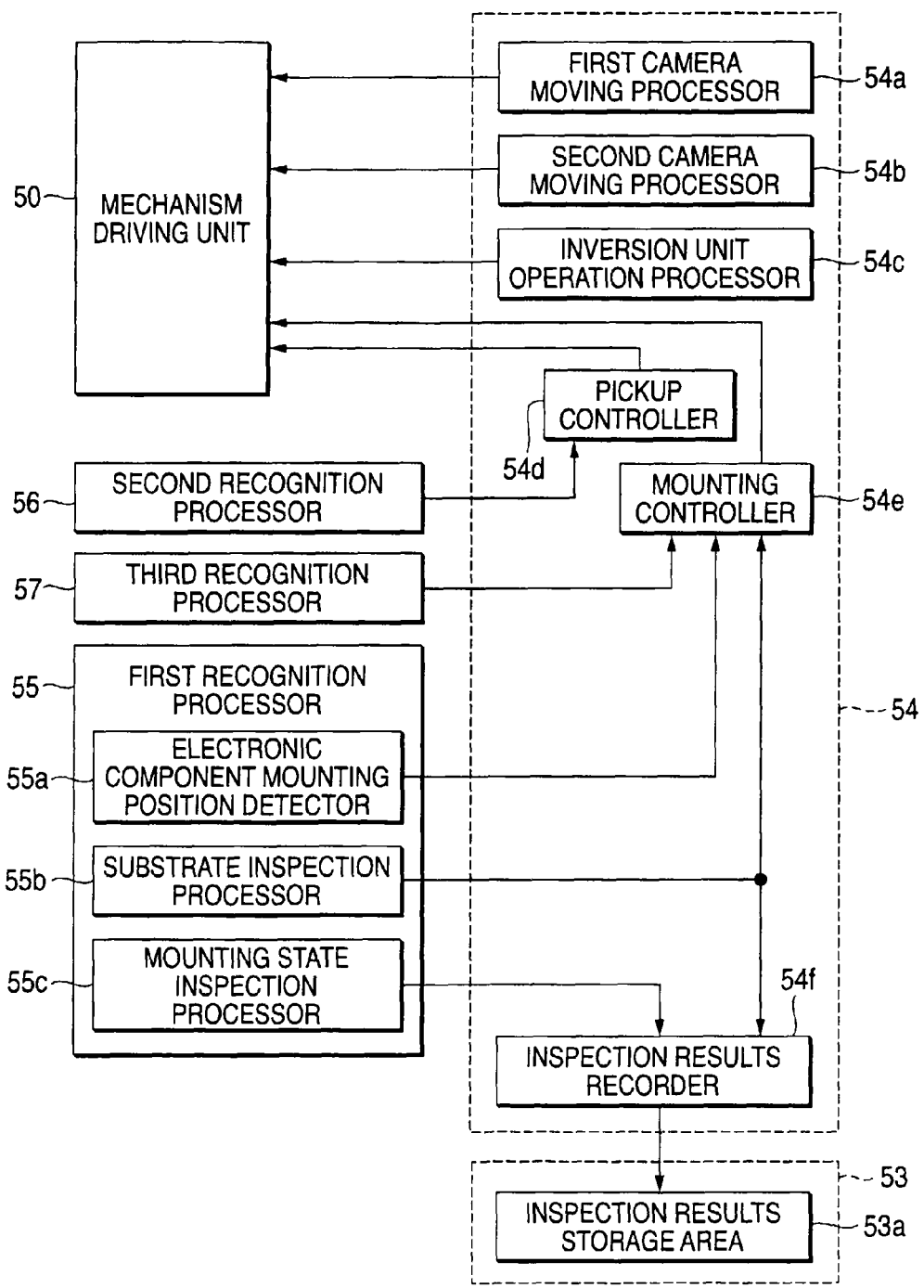
FIG. 8 is a functional block diagram showing the process functions of the electronic component mounting apparatus according to the first embodiment of the invention.
Figure 9:
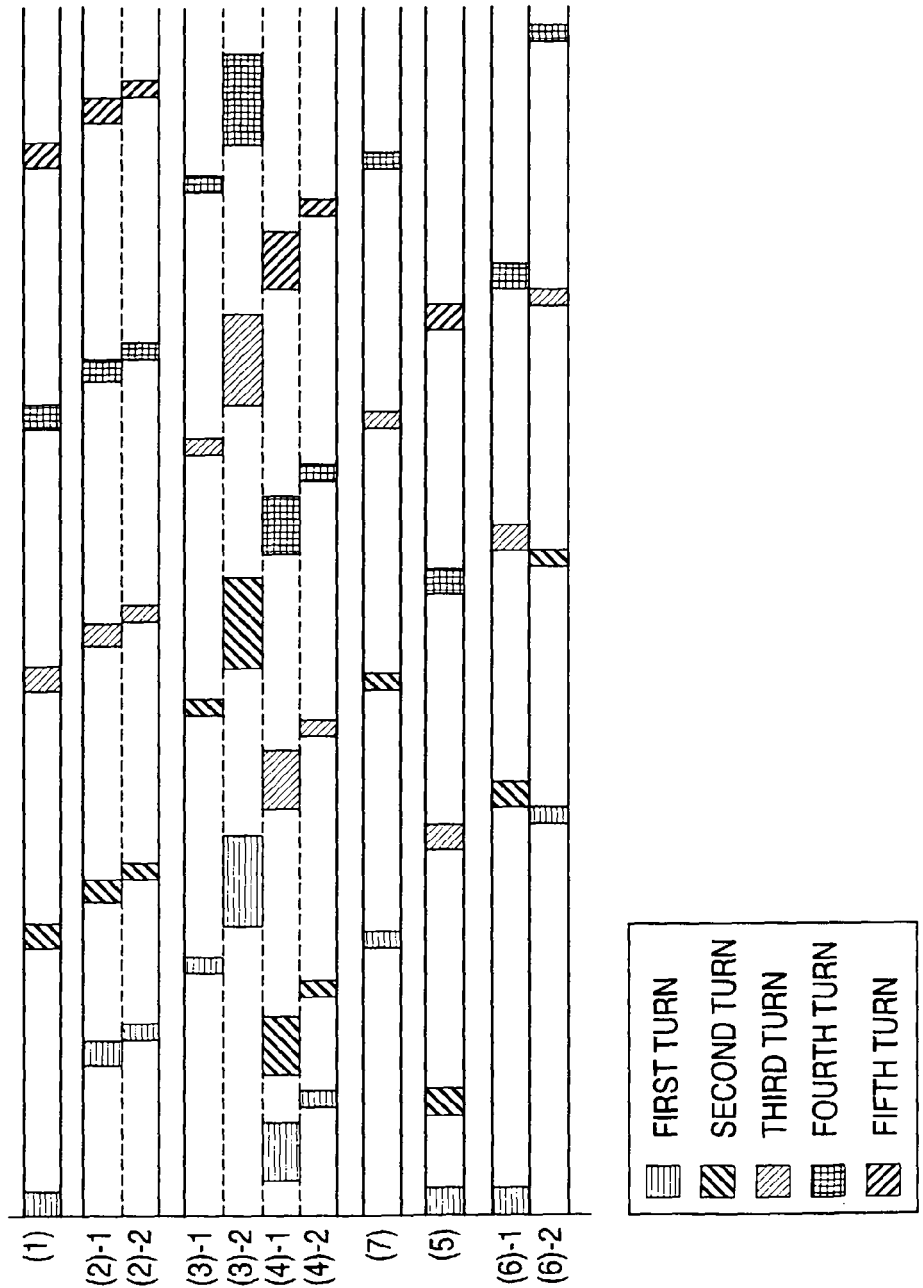
FIG. 9 is a timing chart showing an electronic component mounting method according to the first embodiment of the invention.
Figure 10:
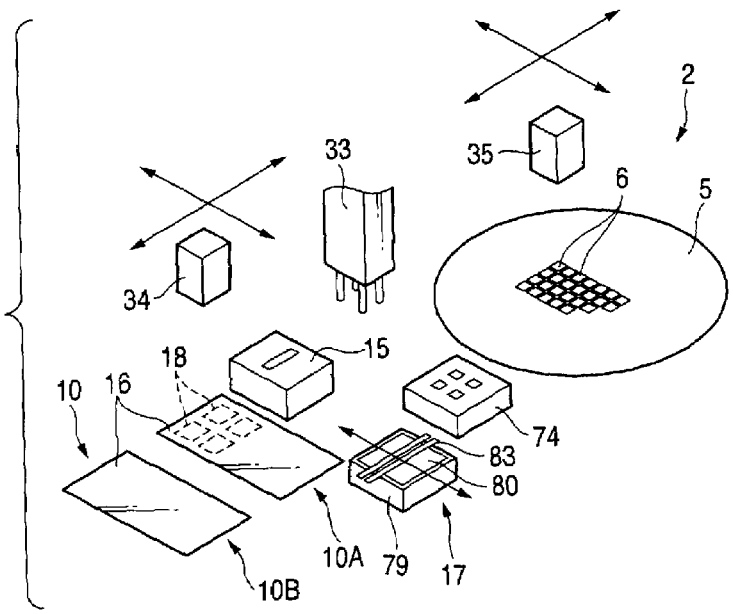
FIGS. 10A and 10B are diagrams for explaining the steps of the electronic component mounting method according to the first embodiment of the invention.
Figure 10:
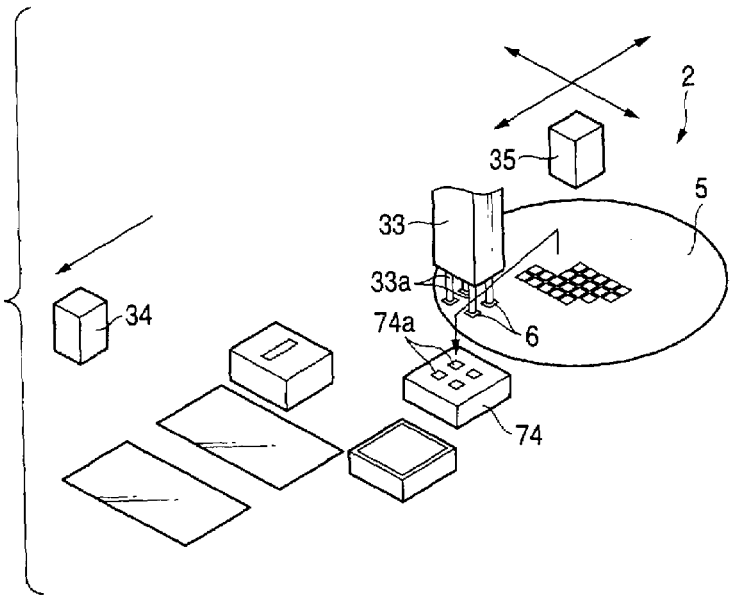
Figure 11:
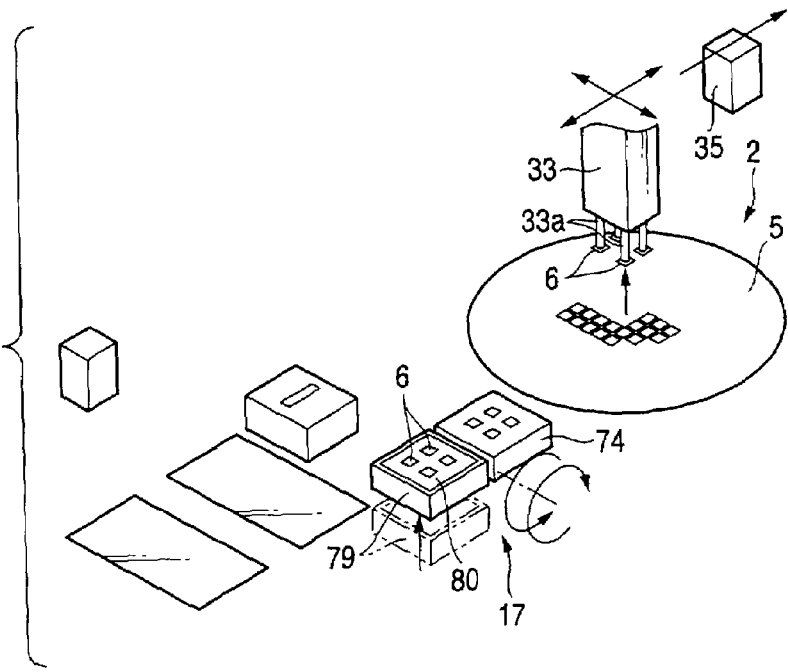
FIGS. 11A and 11B are diagrams showing the steps of the electronic component mounting method according to the first embodiment of the invention.
Figure 11:
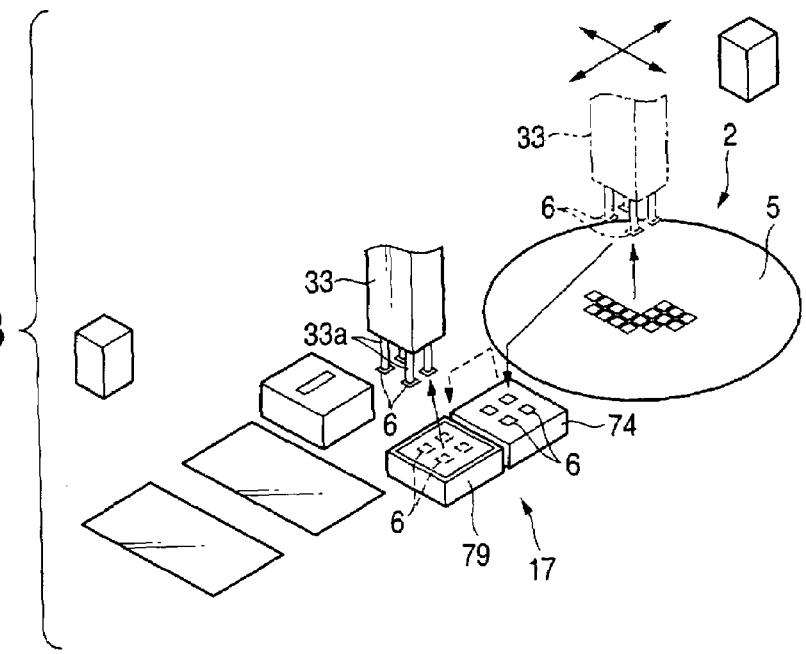

FIG. 1 is a plan view of an electronic component mounting apparatus according to a first embodiment of the present invention. FIG. 2 is a side, cross-sectional view of the electronic component mounting apparatus according to the first embodiment. FIG. 3 is a plan, cross-sectional view of the electronic component mounting apparatus according to the first embodiment. FIG. 4 is a perspective view of the inversion unit of the electronic component mounting apparatus according to the first embodiment. FIGS. 5A, 5B and 6A to 6E are diagrams for explaining the movement of components during the inversion unit of the electronic component mounting apparatus according to the first embodiment. FIG. 7 is a block diagram showing the configuration of the control system of the electronic component mounting apparatus according to the first embodiment. FIG. 8 is a functional block diagram showing the functions performed by the electronic component mounting apparatus according to the first embodiment. FIG. 9 is a timing chart showing an electronic component mounting method according to the first embodiment. FIGS. 10A to 10B, 11A to 11B, 12A to 12B, and 13A to 13B are diagrams for explaining the steps of the electronic mounting method according to the first embodiment. FIGS. 14A to 14E are plan views, according to the first embodiment, of a substrate on which an electronic component is to be mounted.

The overall configuration of an electronic component mounting apparatus will now be described while referring to FIGS. 1, 2 and 3. The view in FIG. 2 is taken along a line A—A in FIG. 1, and the view in FIG. 3 is taken along a line B—B in FIG. 2. In FIG. 1, an electronic component feeding unit 2 is provided on a base anvil 1. As is shown in FIGS. 2 and 3, the electronic component feeding unit 2 includes a jig holder (a jig holding member) 3, and the jig holder 3 detachably holds a jig 4 to which an adhesive sheet 5 is attached.

A semiconductor chip (hereinafter referred to simply as a chip") 6, which is an electronic component, is bonded to the adhesive sheet 5, while being separated to form chip segments. Multiple bumps 6a (see FIG. 5A), which are projecting electrodes, are formed on the upper face of the chip 6, and when the jig 4 is held by the jig holder 3, the electronic component feeding unit 2 feeds the chip 6 while the bump formation face (the projecting electrode formation face) thereof is directed upward.

As is shown in FIG. 2, located below the adhesive sheet 5 held by the jig holder 3 is an ejector 8 that is moved horizontally by an ejector XY table 7. The ejector 8 includes a pin elevating mechanism for raising or lowering an ejector pin (not shown) used for raising a chip. When the chip 6 is to be picked up from the adhesive sheet 5 by using a mounting head, which will be described later, the chip 6 is driven up from below the adhesive sheet 5 by the ejector pin, and is removed from the adhesive sheet 5. The ejector 8 is an adhesive sheet peeling mechanism for peeling the chip 6 away from the adhesive sheet 5.

As is shown in FIG. 3, a substrate holder 10 is arranged at a distance, in the Y direction, from the electronic component feeding unit 2 positioned on the top face of the base anvil 1. Upstream and downstream, in the X direction, the substrate holder 10, a substrate feeding conveyer 12, a substrate sorter 11, a substrate relay unit 13 and a substrate discharging conveyer 14 are sequentially arranged. The substrate feeding conveyer 12 receives from upstream a substrate 16 that it transmits to the substrate sorter 11.

The substrate sorter 11 is so designed that a sorter conveyer 11a can be slid in the Y direction by a slide mechanism 11b. The substrate sorter 11 selectively sorts the substrate 16 (the work), fed by the substrate feeding conveyer 12, to two substrate holding mechanisms of the substrate holder 10, which will be described next. The substrate holder 10 includes a first substrate holding mechanism 10A and a second substrate holding mechanism 10B, and securely locates, at a mounting positions, the substrate 16 sorted by the substrate sorter 11.

In addition to the substrate sorter 11, the substrate relay unit 13 is so designed that a relay conveyer 13a can be slid in the Y direction by a slide mechanism 13b. The substrate relay unit 13 receives the processed substrate 16 by selectively connecting the relay conveyer 13a to the first substrate holding mechanism 10A or the second substrate holding mechanism 10B, and transmits this substrate 16 to the substrate discharging conveyer 14. Thereafter, the substrate discharging conveyer 14 discharges the received substrate 16 downstream.

In FIG. 1, a first Y-axis base 20A and a second Y-axis base 20B are arranged longitudinally in the Y direction, perpendicular to the direction (the X direction) in which the substrate 16 is conveyed. On the top faces of the first Y-axis base 20A and the second Y-axis base 20B, parallel Y-direction guides 21 are respectively longitudinally located along the overall length of the apparatus, so that this pair of Y-direction guides 21 sandwich the electronic component feeding unit 2 and the substrate holder 10.

Three beam members, a first beam 31, a center beam 30, and a second beam member 32, are extended between the Y-direction guides 21, so that these beams can be slid in the Y direction while their ends are supported by the Y-direction guides 21.

A nut member 23b projects from the right side end of the center beam 30, and a feed screw 23a, which the nut member 23b engages, is rotated by a Y-axis motor 22, horizontally arranged on the first Y-axis base 20A. When the Y-axis motor 22 is driven, the center beam 20 is moved horizontally along the Y-axis guides 21 in the Y direction.

Likewise, nut members 25b and 27b project from the left side ends of the first beam 31 and the second beam 32, and feed screws 25a and 27a, which are respectively engaged by the nut members 25b and 27b, are rotated by Y-axis motors 24 and 26, horizontally arranged on the second Y-axis base 20B. When the Y-axis motors 24 and 26 are driven, the first beam 31 and the second beam 32 are moved horizontally along the Y-axis guides 21 in the Y direction.

A mounting head 33, with which a nut member 41b is coupled, is attached to the center beam 30, and a feed screw 41a, which the nut member 41b engages, is rotated by an X-axis motor 40. When the X-axis motor 40 is driven, the mounting head 33 is moved in the X direction along X-direction guides 42 (see FIG. 2) that are provided on the side face of the center beam 30 in the X direction.

The mounting head 33 includes multiple (four in this embodiment) nozzles 33a, used to vacuum-chuck one chip 6 each, and can be moved while the chips 6 are vacuum-chucked by the nozzles 33a. When the Y-axis motor 22 and the X-axis motor 40 are driven, the mounting head 33 is moved horizontally, either in the X direction or the Y direction, and the chips 6 on the electronic component feeding unit 2 are picked up and held, and are mounted at electronic component mounting positions 16a on the substrate 16 supported by the substrate holder 10.

The pair of Y-direction guides 21, the center beam 30, the Y-direction driving mechanism (the Y-axis motor 22, the feed screw 23a and the nut member 23b), which moves the center beam 30 along the Y-direction guides 21, and the X-direction driving mechanism (the X-axis motor 40, the feed screw 41a and the nut member 41b), which moves the mounting head 33 between the electronic component feeding unit 2 and the substrate holder 10, constitute a mounting head moving mechanism.

A first camera 34 is attached to the first beam 31, and a nut member 44b is coupled with a bracket 34a that holds the first camera 34. A feed screw 44a that the nut member 44b engages is rotated by the X-axis motor 43, and when the X-axis motor 43 is driven, the first camera 34 is moved in the X direction along X-direction guides 45 (see FIG. 2) provided on the side face of the first beam 31.

The first camera 34 is moved horizontally in the X direction and the Y direction by driving the Y-axis motor 24 and the X-axis motor 43. As a result, the first camera 34 can be moved above the substrate holder 10 to obtain images of the substrate 16 that is held by the first substrate holding mechanism 10A and the second substrate holding mechanism 10B of the substrate holder 10, and can also be retracted from above the substrate holder 10.

The pair of Y-direction guides 21, the first beam 31, and the Y-direction driving mechanism (the Y-axis motor 24, the feed screw 25a and the nut member 25b), which drives the first beam 31 along the Y-direction guides 21, and the X-direction driving mechanism (the X-axis motor 43, the feed screw motor 44a and the nut member 44b), which drives the first camera 34 along the X-direction guides 45, constitute a first camera moving mechanism for at least moving the first camera 34 above he substrate holder 10.

A second camera 35 is attached to the second beam 32, and a nut member 47b is coupled with a bracket 35a for holding the second camera 35. A feed screw 47a engaged by a nut member 47b is rotated by the X-axis motor 46. When the X-axis motor 46 is driven, the second camera 35 is moved in the X direction along X-direction guides 48 (see FIG. 2) provided on the side face of the second beam 32.

The second camera 35 is moved horizontally in the X direction and the Y direction by driving the Y-axis motor 26 and the X-axis motor 46. As a result, the second camera 35 can be moved above the electronic component feeding unit 2 to obtain images of the chip 6 held by the electronic component feeding unit 2, and can also be retracted from above the electronic component feeding unit 2.

The pair of Y-direction guides 21, the second beam 32, the Y-direction driving mechanism (the Y-axis motor 26, the feed screw 27a and the nut member 27b), which moves the second beam 32 along the Y-direction guides 21, and the X-direction driving mechanism (the X-axis motor 46, the feed screw 47a and the nut member 47b), which moves the second camera 35 along the X-direction guides 48, constitute a second camera moving mechanism for at least moving the second camera above the electronic component feeding unit 2.

As is shown in FIG. 3, a third camera 15 and an inversion unit 17 are arranged between the electronic component feeding unit 2 and the substrate holder 10. The third camera 15 is a line camera, and the mounting head 33, whereon chips 6 are held by the nozzles 33a, is moved above the third camera 15 to obtain images of the chips 6.

The inversion unit 17 will now be described while referring to FIGS. 4, 5 and 6. In FIG. 4, two upright support posts 72, coupled with a block 71, are provided on a horizontal base member 70. An inversion table 73 is rotatably supported around a horizontal shaft 73a by the support posts 72, and an inversion actuator 75 is coupled with the shaft 73a. The shaft 73a is rotated 180 degrees by driving the inversion actuator 75, and the inversion table 73 is inverted vertically.

A holding head 74 is provided on the inversion table 73, and multiple chip holders 74a (electronic component holders) provided with vacuum holes 74b are arranged on the holding head 74. While the chips 6 are mounted with their bump formation surfaces facing upward on the chip holders 74a, the chips 6 are vacuum-chucked by the chip holders 74a using the vacuum holes 74b. That is, the chip holders 74a hold the chips 6 from their reverse faces, while their bump formation surfaces are directed upward (see FIG. 5A).

For the transfer of the chips 6 to the holding head 74, the chips 6 are picked up from the electronic component feeding unit 2 by the nozzles 33a of the mounting head 33, and are mounted on the holding head 74 with the chip holders 74a facing upward. Therefore, the arrangement of the chip holders 74a on the holding head 74 is set so as to match the arrangement of the nozzles 33a for the mounting head 33.

Two upright slide posts 76 are provided on the base member 70, and sliders 77 are fitted around the slide posts 76 so they can slide vertically. The sliders 77 are coupled with an elevating table 78, to which a rod 84a for an elevating actuator 84 is coupled. When the elevating actuator 84 is driven, the elevating table 78 is moved up and down along the slide posts 76.

A stage 79, which is a flat-bottomed container having a flat bottom 79a, is provided on the top face of the elevating table 78. As will be described later, the stage 79 serves as a transfer stage used to transfer a flux 80a, which is viscous liquid supplied to the bottom 79a, to bumps 6a on the chips 6, coating them with the material, and as a flattening stage that is pressed against and flattens the distal ends of the bumps 6a during the transfer operation. The stage 79 also serves as an arrangement stage used to provide a predetermined array of chips 6, onto which the flux 80 has been transferred and applied, in order for the extraction process to be performed by the mounting head 33.

Adjacent to the side face of the elevating table 78 is a horizontally extended slide cylinder 81 along which a slide block 82 reciprocates horizontally. A squeegee unit 83, provided with two vertically displaceable squeegees 83a and 83b (see FIGS. 6A to 6E), is mounted on the slide block 82 and is extended so that it passes above the stage 79. As will be described later, the squeegees 83a and 83b respectively serve as a flux scraping squeegee and a flux spreading squeegee.

Figure 6A:
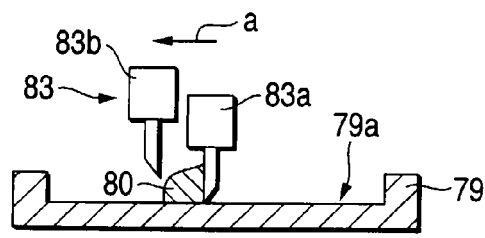
FIGS. 6A to 6E are diagrams for explaining the operation of the inversion unit of the electronic component mounting apparatus according to the first embodiment of the invention.
Figure 6B:
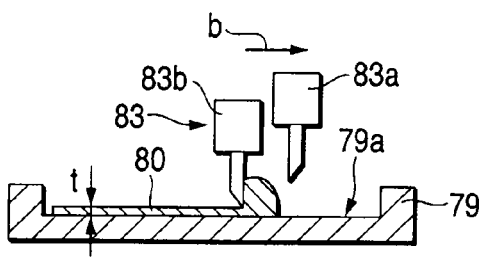

The flux 80 is fed onto the bottom face 79a, and the squeegee 83a descends until it contacts the bottom 79a, as is shown in FIG. 6A. The squeegee unit 83 is then moved horizontally, in the direction indicated by an arrow a, while the flux 80 is scraped across the bottom face 79a to one side. In the next stage, as is shown in FIG. 6B, the squeegee 83b is lowered until there is a predetermined gap between its lower end and the bottom face 79a. Then, while maintaining the gap, the squeegee unit 83 is moved horizontally, in the direction indicated by an arrow b, and the squeegee 83b evenly spreads the flux 80 across the bottom face 79a.

As a result, a flux film 80a, having an even liquid level and a predetermined thickness t, is deposited across the bottom face 79a. The stage 79 can thus serve as viscous liquid supply unit for supplying the adhesive flux film 80a. As viscous liquid other than the flux 80, an adhesive (resin glue) can be employed in accordance with the type of bumps 6a.

Figure 5A:
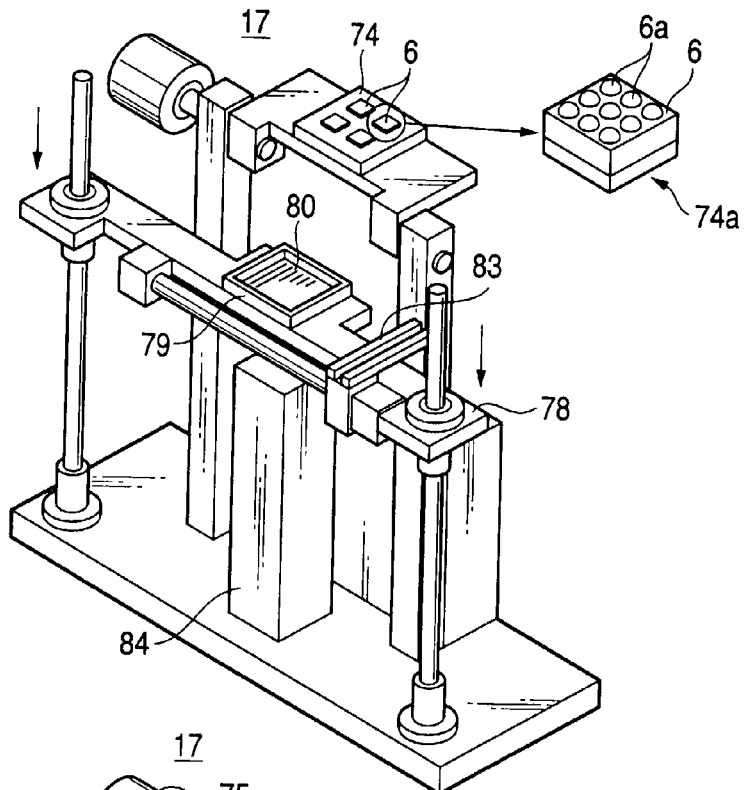
FIGS. 5A and 5B are diagrams for explaining the operation of the inversion unit of the electronic component mounting apparatus according to the first embodiment of the invention.
Figure 5B:
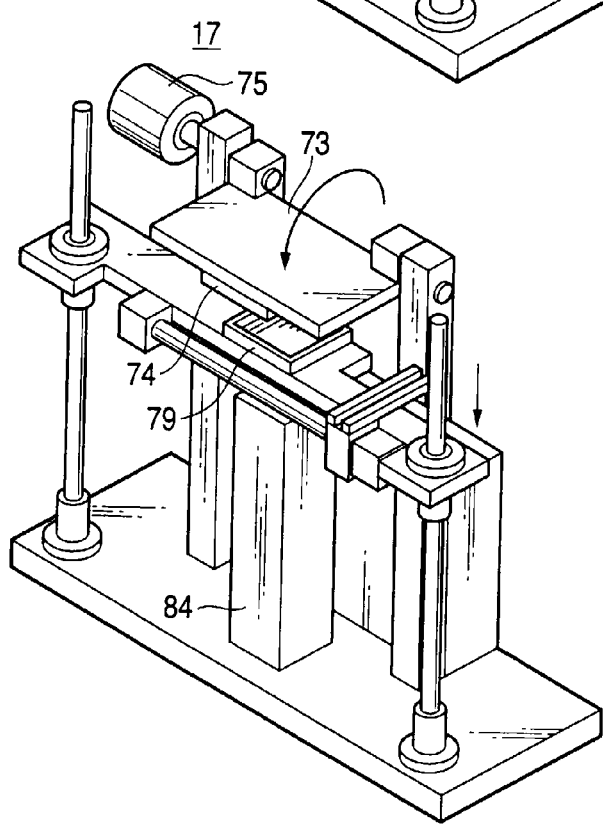
Figure 6C:
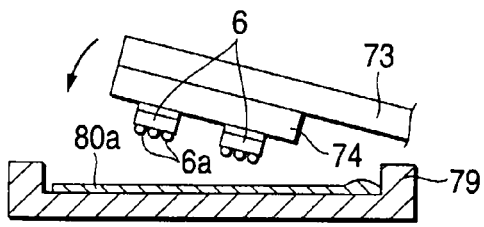

When the formation of the flux film 80a has been completed in this manner, as is shown in FIG. 5A, the elevating actuator 84 is driven to lower the elevating table 78. As a result, the stage 79 is lowered to a position whereat the flux 80 can be transferred. In this state, as is shown in FIG. 5B, the inversion actuator 75 is driven to invert the inversion table 73 relative to the stage 79. Through this inversion operation, as is shown in FIG. 6C, the holding head 74, whereon the chips 6 are vacuum-chucked on the chip holders 74a, is lowered in an arched descent to the stage 79 wherein the flux film 80a is deposited.

Figure 6D:
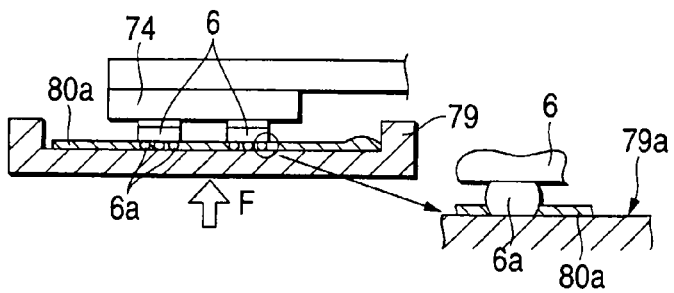

As is shown in FIG. 6D, when the bumps 6a on the chips 6 contact the bottom face 79a of the stage 79, a load F, for driving the stage 79 upward, is exerted by the elevating actuator 84, pressing the bottom face 79a against and flattening the lower faces of the bumps 6a, i.e., the distal ends of the bumps 6a are flattened and aligned so that the heights of the bumps 6a are uniform. The elevating actuator 84, therefore, is a pressurization mechanism that, by using the stage 79 to apply pressure, shapes the bumps 6a on the chips 6 that are mounted on the holding head 74.

Figure 6E:
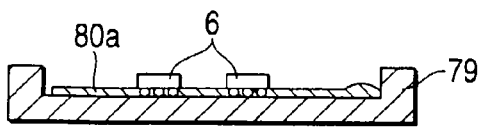

Thereafter, the inversion table 73 is again inverted, and the holding head 74 is returned to the original position shown in FIG. 4. Thus, as is shown in FIG. 6E, the chips 6 are arranged on the stage 79 with the bumps 6a contacting the flux film 80a. In this case, the size of the stage 79 is determined in accordance with the size of the holding head 74, and is large enough to permit the chips 6 held by the chip holders 74a to be arranged on the flux film 80a. The array of the chips 6 on the stage 79 is the same as the array of the nozzles 33a on the mounting head 33.

The holding head 74, which initially holds the reverse faces of the chips 6 with the bump formation faces directed upward, the inversion table 73 for inverting the holding head 74, and the inversion actuator 75 constitute arrangement means for evenly and levelly positioning the chips 6 on the flux 80, which the bumps 6a contact. This arrangement means vertically inverts the holding head 74 relative to the stage 79, and positions, on the flux 80, the chips 6 held by the holding head 74. During the operation performed to arrange the chips 6, as the holding head 74 is inverted, the flux 80 is transferred to and coats the lower ends of the bumps 6a. As a result, the coating with the flux (viscous liquid), which conventionally is performed by the mounting head 33, is performed at the same time as the holding head 74 is inverted by the inversion table 73.

When the chips 6 have been arranged on the flux 80 on the stage 79, the elevating table 78 is raised by the elevating actuator 84, positioning the stage 79 at the relay height. In this state, the chips 6 located on the stage 79 are again held by the nozzles 33a on the mounting head 33, and are mounted on the substrate 16 held by the substrate holder 10. Then, in the period during which the mounting head 33 is moved to the substrate 16, the mounting head 33 that is holding the chips 6 is moved above the third camera 15 in the X direction, and the third camera 15 obtains images of the chips 6 held by the mounting head 33.

Therefore, the mounting head 33 and the mounting head moving mechanism constitute mounting means having the following functions. This mounting means includes the mounting head 33 having the nozzles 33a used to vacuum-chuck the chips 6. The mounting head 33 picks up multiple chips 6 from the electronic component feeding unit 2 and transfers the chips 6 to the holding head 74. The chips 6 are arranged on the flux 80 on the stage 79 by inverting the holding head 74, and are extracted by the vacuum-chuck applied through the nozzles 33a of the mounting head 33. Then, the chips 6 held by the mounting head 33 are mounted on the substrate 16.

The configuration of the control system for the electronic component mounting apparatus will now be described while referring to FIG. 7. In FIG. 7, a mechanism driving unit 50 comprises: a motor driver for electrically driving the motors of the following mechanisms; and a control device for controlling air pressure supplied to the air cylinders of the individual mechanisms. A controller 54 controls the mechanism driving unit 50 for driving the following components.

The X-axis motor 40 and the Y-axis motor 22 drive the mounting head moving mechanism for moving the mounting head 33, the X-axis motor 43 and the Y-axis motor 24 drive the first camera moving mechanism for moving the first camera 34, and the X-axis motor 46 and the Y-axis motor 26 drive the second camera moving mechanism for moving the second camera 35.

The mechanism driving unit 50 drives the mechanism for elevating the mounting head 33 and a component vacuum-chucking mechanism for using the nozzles 33a (see FIG. 2), and also drives the actuator 75 for inverting the inversion unit 17, the actuator 84 for elevating the stage 17, and the cylinder for elevating the ejector 8 and the motor for driving the ejector XY table 7. Moreover, the mechanism driving unit 50 drives the substrate feeding conveyer 12, the substrate discharging conveyer 14, the substrate sorter 11, the substrate relay unit 13, the first substrate holding mechanism 10A and the second substrate holding mechanism 10B.

A first recognition processor 55 processes the image obtained by the first camera 34, and identifies the electronic component mounting positions 16a (see FIGS. 14A to 14E) on the substrate 16 held by the substrate holder 10. The electronic component mounting positions 16a represent the overall positions of electrodes 16b on the substrate 16 to which the bumps 6a on the chips 6 are connected, and these positions can be detected by image recognition.

The first recognition processor 55 also performs a substrate quality inspection by detecting the presence/absence of a bad mark that is provided, at the previous step, for each electronic component mounting position 16a of the substrate 16. In addition, the first recognition processor 50 also processes the image obtained by the first camera 34 to determine the mounting state, such as the shifting of the positions of the chips 6 located at the electronic component mounting positions 16a.

A second recognition processor 56 processes the image obtained by the second camera 35, and obtains the positions of the chips 6 on the electronic component feeding unit 2. A third recognition processor 57 processes the image obtained by the third camera 15, and obtains the positions of the chips 6 held by the mounting head 33. Therefore, the third recognition processor 57 serves as electronic component recognition means for identifying the positions of the chips 6 based on the image obtained by the third camera 15.

The results obtained by the first recognition processor 55, the second recognition processor 66 and the third recognition processor 57 are transmitted to the controller 54. A data storage unit 53 stores various types of data, such as the substrate inspection results and the inspection results obtained for the mounting states of the chips 6. An operating unit 51 is an input device, such as a keyboard or a mouse, used for entering data and control commands. A display unit 52 displays the images obtained by the first camera 34, the second camera 35 and the third camera 15, and guide messages for data input using the operating unit 51.

The processing functions of the electronic component mounting apparatus will now be described while referring to FIG. 8. In FIG. 8, a block 54 represents the processing function of the controller 54 in FIG. 7. The functions implemented by a first camera moving processor 54a, a second camera moving processor 54b, an inversion unit operation processor 54c, a pickup controller 54d and a mounting controller 54e respectively constitute first camera moving control means, second camera moving control means, inversion unit operation control means, pickup control means and mounting control means.

Under the control of the first camera moving processor 54a, the first camera moving mechanism positions the first camera 34 in order to obtain images of the substrate 16 held by the substrate holder 10, and retracts the first camera 34 to a position whereat it does not interfere with the mounting of the chip 6 by the mounting head 33. In this case, images of the substrate 16 are obtained at three places, at a bad mark provision position while the substrate 16 is being fed, at the electronic component mounting position 16a before the chip 6 is mounted on the substrate 16, and at the electronic component mounting position 16a after the chip 6 has been mounted.

Under the control of the second camera moving processor 54b, the second camera moving mechanism positions the second camera 35 in order to obtain images of the chip 6 on the electronic component feeding unit 2, or retracts the second camera 35 to a position whereat it does not interfere with the pickup of the electronic component by the mounting head 33.

The inversion unit operation processor 54c controls the inversion actuator 75, the elevating actuator 84 and the squeegee unit 83, and also controls the vacuum suction through the vacuum holes 74b of the holding head 74, so that the arrangement operation can be performed for vertically inverting the chips 6 received from the mounting head 33, and for positioning the chips 6 on the flux film 80a.

Under the control of the pickup controller 54d, the mounting head moving mechanism, based on the locations of the chips 6 obtained by the second recognition processor 56, positions the mounting head 33 so that the mounting head 33 can pick up the chips 6 from the electronic component feeding unit 2.

Under the control of the mounting controller 54e, the mounting head moving mechanism, based on the electronic component mounting positions 16a obtained by an electronic component mounting position detector 55a of the first recognition processor 55 and the positions of the chips obtained by the third recognition processor 57, positions the mounting head 33 so that the mounting head 33 can mount the chips 6 on the substrate 16 held by the substrate holder 10. Therefore, the mounting controller 54e serves as mounting control means that, based on the recognition results obtained by the electronic component recognition means, permits the mounting means to position, on the substrate 16, the chips 6 held by the mounting head 33.

The first recognition processor 55 includes not only the electronic component mounting position detector 55a, but also a substrate inspection processor 55b and a mounting state inspection processor 55c. During the mounting operation controlled by the mounting controller 54e, the quality inspection results for the substrate 16, obtained by the substrate inspection processor 55b, are employed to mount the chips 6 only at the electronic component mounting positions 16a determined to be good.

An inspection results recorder 54f stores the substrate quality inspection results obtained by the substrate inspection processor 55b and the inspection results for the mounting states of the chips 6 obtained by the mounting state inspection processor 55c. These inspection results are transmitted to the inspection results recorder 54f for processing, and the resultant data are stored in an inspection results storage area 53a in the data storage unit 53.

For the thus arranged electronic component mounting apparatus, an electronic component mounting method will now be explained while referring to the timing chart in FIG. 9 and FIGS. 10A to 14E. In FIG. 9, a time-series correlation is shown between the individual unit steps in the electronic component mounting processing for the first turn to the fifth turn.

The unit steps are: a liquid level evening step (1), an arrangement step (2), a mounting step (3), a transfer step (4), a component recognition step (5), a step recognition step (6) and a component recognition step (7). As is shown in FIG. 9, of these steps, the arrangement step (2), the mounting step (3), the transfer step (4) and the substrate recognition step (6) are divided into two sub-unit steps to be performed sequentially in a time series.

The unit steps will now be explained.

The liquid level evening step (1) is a step of using the squeegee unit 83 to spread the flux 80 across the bottom face 79a, which is a flat stage, and of evening the liquid level. When the squeegee unit 83 performs the squeegee operation for the inversion unit 17, the flux film 80a, which has an even liquid level, is deposited on the bottom face 79a of the stage 79 (see FIG. 10A).

The arrangement step (2) is a step of vertically inverting, relative to the stage 79, the holding head 74 that is vacuum-chucking the reverse faces of the chips 6 with the pump formation faces thereof directed upward, and of arranging on the flux 80, for which the liquid level has been evened, the chips 6 held by the holding head 74. Also at the arrangement step, the chips 6 held by the holding head 74 are positioned on the flux 80 spread across the flat stage, so that the flux 80 is coated on the bumps 6a of the chips 6.

The arrangement step (2) includes the following two sub-steps. An arrangement step (2)-1 is a step of inverting the holding head 74 whereon the chips 6 are held, and of pressing the chips 6 against the stage 79, where the flux film 80a is deposited, so as to align the heights of the bumps 6a. An arrangement (returning and elevating) step (2)-2 is a step of returning the holding head 74 to the original position after the heights of the bumps 6a are aligned, and of elevating the stage 79 whereon the chips 6 are positioned after this bump shaping operation (see FIG. 11A).

The arrangement step (inversion and shaping) (2)-1 also serves as a pressurized arrangement step. At this step, the holding head 74 is vertically inverted so that the chips 6 held by the holding head 74 face the bottom face 79a of the stage 79, the distal ends of the bumps 6a of the chips 6 are pressed against the bottom face 79a to flatten them, and the chips 6 are arranged on the stage 79. Before this shaping operation, the liquid level evening step (1) is performed, and during the shaping operation, the flux 80 is coated on the bumps 6a of the chips 6.

The mounting step (3) is a step of using the vacuum-chuck, provided by employing the nozzles 33a of the mounting head 33, to separate the chips 6 from the bottom face 79a of the stage 79 and to mount the chips 6 on the substrate 16. This mounting step includes the following two sub-steps. A mounting step (extraction) (3)-1 is an extraction step of using the vacuum-chuck, provided by employing the nozzles 33a of the mounting head 33, to separate the chips 6 from the flux 80 deposited on the bottom face 79a of the stage 79 (see FIG. 11B). In this case, the nozzles 33a are used to simultaneously extract a plurality of the chips 6 from the stage 79.

Figure 12A:
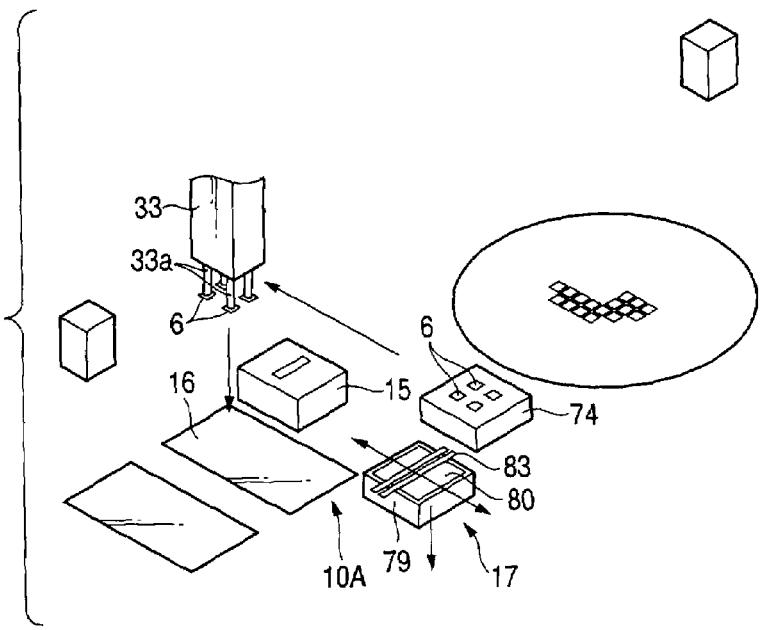
FIGS. 12A and 12B are diagrams showing the steps of the electronic component mounting method according to the first embodiment of the invention.
Figure 12B:
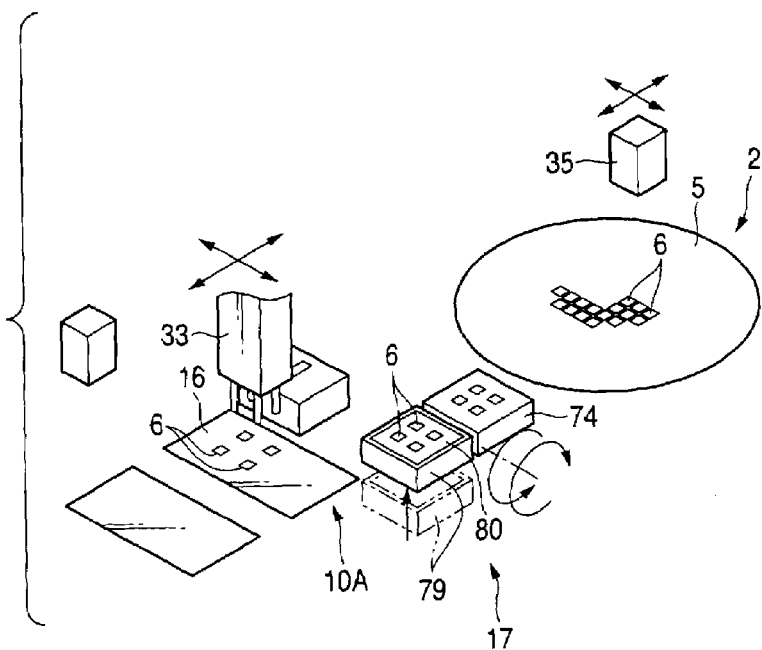
Figure 13:
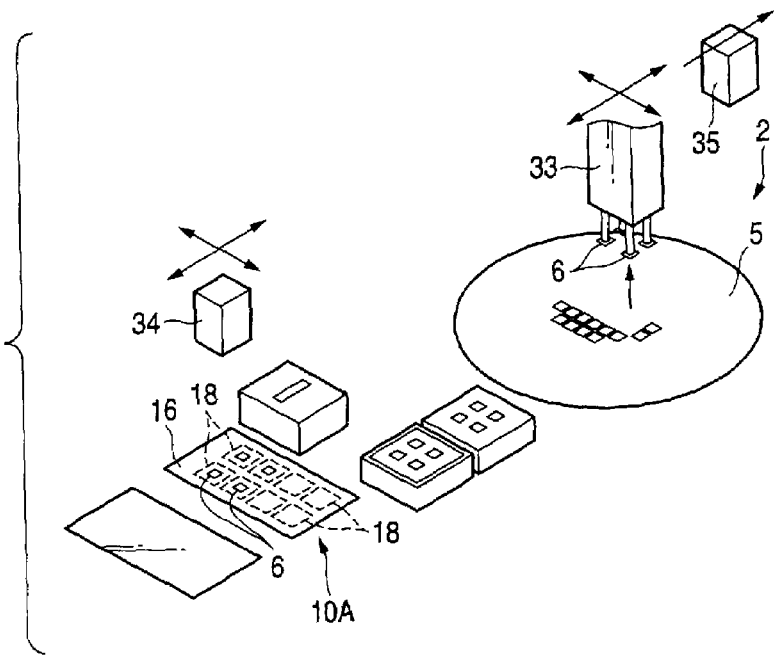
FIGS. 13A and 13B are diagrams showing the steps of the electronic component mounting method according to the first embodiment of the invention.
Figure 13:
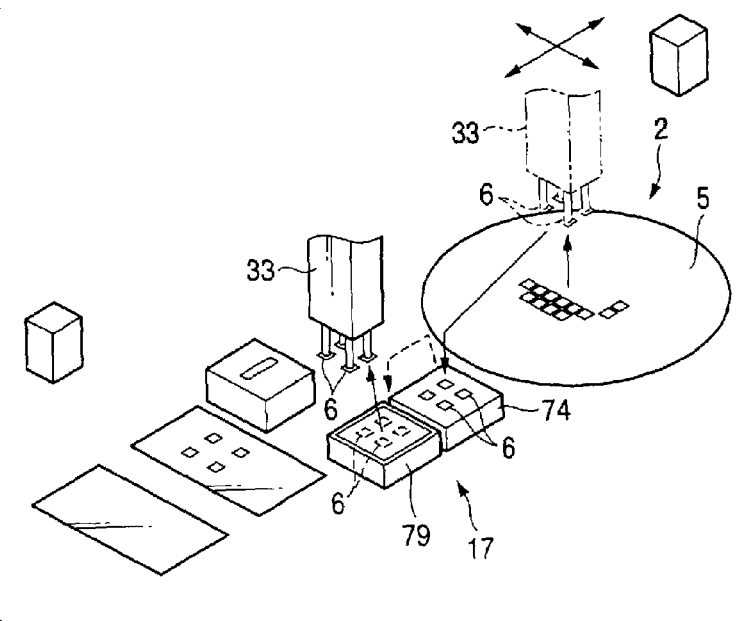
Figure 14:
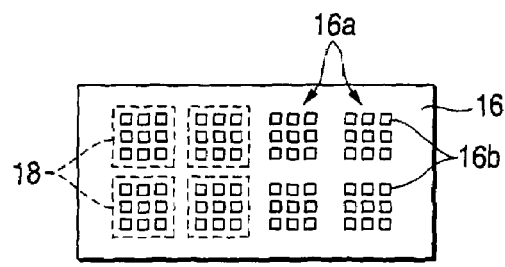
FIGS. 14A to 14E are plan views of a substrate, according to the first embodiment of the invention, on which electronic components are to be mounted.
Figure 14:
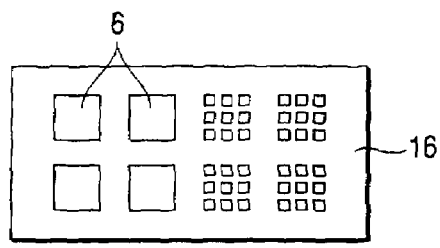
Figure 14:
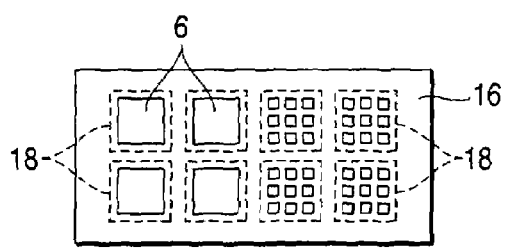
Figure 14:
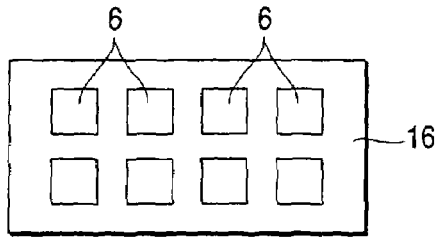
Figure 14:
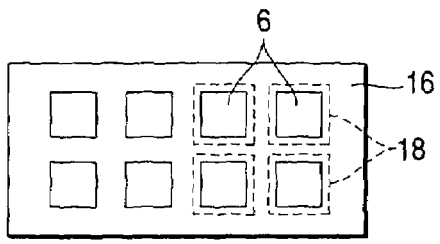

A mounting step (mounting) (3)-2 is a step, based on the recognition results obtained at the component recognition step, of moving the mounting head 33 so as to position, on the substrate 16, the chips 6 held by the nozzles 33a, and of mounting the individual chips 6 on the substrate 16 (see FIG. 12B).

The transfer step (4) is a step of using the mounting head 33 to pick up the chips 6 from the electronic component feeding unit 2 and to transfer the chips 6 to the holding head 74. The transfer step includes the following two sub-steps. A transfer step (pickup) (4)-1 is a step of using the nozzles 33a of the mounting head 33 to pick up the individual chips 6, which are supplied by the electronic component feeding unit 2 with the bump formation faces directed upward (see FIG. 10B).

A transfer step (relay) (4)-2 is a step of transferring the chips 6, while the reverse faces of the chips 6, after they are picked up and removed from the electronic component feeding unit 2, are held by the chip holders 74a of the holding head 74 (see FIG. 11B). In this case, a plurality of the chips 6 are simultaneously transferred from the nozzles 33a of the mounting head 33 to the holding head 74. This transfer step (4)-2 is an electronic component holding step of holding the chips 6 on the holding head 74 with the chip holders 74a facing upward.

A component recognition step (5) is a step of identifying the locations of the chips 6 by using the second camera 35 to obtain images of the chips 6 (see FIGS. 10A, 10B and 11B). And a substrate recognition step (6) is a step of performing a predetermined image recognition procedure by using the first camera 34 to obtain images of the substrate 16 held by the substrate holder 10, and includes the following two sub-steps.

A substrate recognition step (mounting position recognition) (6)-1 is a step of using the first camera 34 to obtain images of the substrate 16 before the chips 6 are mounted, and of identifying the electronic component mounting positions 16a (see FIG. 10A). And a substrate recognition step (mounting state inspection) (6)-2 is a step of obtaining images of the substrate 16 after the chips 6 have been mounted thereon to examine the mounting state (see FIG. 13A). A component recognition step (7) is a step of using the third camera 15 to obtain images of the chips 6 that have not yet been mounted and are held by the mounting head 33, and of identifying the positions of the chips 6 based on the image obtained of the substrate 16 (see FIG. 12A).

The electronic component mounting method will now be described by referring to the time-series correlation between the unit steps. In FIG. 10A, multiple chips 6 are glued to the adhesive sheet 5 of the jig 4 held by the electronic component feeding unit 2, while the substrate 16 is positioned by the first substrate holding mechanism 10A and the second substrate holding mechanism 10B of the substrate holder 10.

Initially, the first turn is begun. As is shown in FIG. 10A, the second camera 35 is moved and positioned above the electronic component feeding unit 2, and images of a plurality (four) of the chips 6 to be mounted during the first turn are obtained. Then, the images obtained by the second camera 35 are processed by the second recognition processor 56 to obtain the locations of the chips 6.

At this time, the first camera 34 is moved and positioned above the substrate 16 held by the first substrate holding mechanism 10A of the substrate holder 10. Thereafter, the first camera 34 is sequentially moved so that, as is shown in FIG. 14A, of the eight electronic component positions 16a set on the substrate 16, four positions 16a on the left are fitted into image fetching ranges 18. Then, images are obtained by obtaining images of the electronic component mounting positions 16a. The images for the image fetching ranges 18 obtained by the first camera 34 are processed by the first recognition processor 55 to obtain the electronic component mounting positions 16a on the substrate 16.

Paralleling this operation, the squeegee process is performed for the inversion unit 17, i.e., the squeegee unit 83 spreads the flux 80 across the stage 79 to deposit the flux film 80a. That is, in this case, the component recognition step (5), the substrate recognition step (mounting position recognition) (6)-1 and the liquid level evening step (1) are simultaneously performed in parallel (see FIG. 9).

Next, the mounting head 33 is moved and positioned above the electronic component feeding unit 2. Then, as is shown in FIG. 10B, based on the chip 6 locations that were previously identified, the mounting head 33 is sequentially positioned so that individual chips 6 are sequentially picked up by the four nozzles 33a. Then, the mounting head 33 is moved and positioned above the holding head 74, and the chips 6 held by the mounting head 33 are transferred to the chip holders 74a.

When the mounting head 33 is retracted from above the electronic component feeding unit 2, the second camera 35 is immediately moved and positioned above the electronic component feeding unit 2 and obtains images of the chips 6 to be mounted in the second turn, so as to obtain the positions of these chips 6. In this case, the transfer step (pick up) (4)-1 and the transfer step (relay) (4)-2 are performed in the named order, and the component recognition step (5) is performed in parallel to the transfer step (relay) (4)-2 (see FIG. 9).

Following this, as is shown in FIG. 11A, when the second camera 35 has been retracted from the electronic component feeding unit 2, the mounting head 33 is moved and positioned above the electronic component feeding unit 2, and picks up the individual chips 6 to be mounted in the second turn. In parallel to this process, the stage 79 of the inversion unit 17, on which the flux film 80 has been deposited at the liquid level evening step (1), is lowered to the transfer height position, and the holding head 74 is vertically inverted relative to the stage 79. Thus, the bumps 6a of the chips 6 held by the holding head 74 are brought in contact with the bottom face 79 of the stage 79. When the stage 79 is pushed upward, the distal ends of the bumps 6a of the chips 6 are shaped and flattened (see FIG. 6D).

Thereafter, vacuum suction through the vacuum holes 74b is halted, the holding head 74 is inverted to the original position, and the stage 79 is elevated to the relay height position. That is, in this case, the transfer step (pickup) (4)-1 and the arrangement step (2) (the arrangement step (inversion and shaping) (2)-1 and the arrangement step (returning and elevating) (2)-2 are performed in parallel.

Then, as is shown in FIG. 11B, the mounting head 33, which has picked up the chips 6 from the electronic component feeding unit 2, is moved and positioned above the holding head 74. Thereafter, when the chips are transferred from the mounting head 33 to the holding head 74, the mounting head is immediately moved and positioned above the stage 79, and the nozzles 33a are employed to separate the chips from the flux film 80a.

The mounting step (extraction) (3)-1 is performed sequentially following the transfer step (relay) (4)-2. And when at the transfer step (4)-2 the chips 6 have been transferred from the mounting head 33 to the holding head 74, the chips 6 are immediately extracted from the stage 79 by using the nozzles 33a on the mounting head 33.

Then, as is shown in FIG. 12A, when the chips 6 are extracted from the stage 79, they liquid level evening step is performed for the inversion unit 17, i.e., the squeegee unit 83 evens out the liquid level of the flux 80 on the stage 79, and the flux film 80a is again deposited on the stage 79.

After the chips 6 have been extracted from the stage 79 and are being held by the nozzles 33a, scanning by the mounting head is performed by moving it above the third camera 15. It is then is moved and positioned above the substrate 16, held by the first substrate holding mechanism 10A. The images of the chips 6 are fetched by scanning, and the locations of the chips are identified. In this case, the component recognition step (before mounting) (7) and the liquid level evening step (1) are performed in parallel.

Thereafter, as is shown in FIG. 12B, the chips 6 are mounted on the substrate 16 by the mounting head 33. In this embodiment, the mounting process is performed based on the electronic component mounting positions 16a obtained by the first recognition processor 55, the locations of the chips 6 obtained by the third recognition processor 57, and the substrate inspection results. As a result, as is shown in FIG. 14B, the chips 6 are mounted at four electronic component mounting positions 16a on the substrate 16.

While the mounting head 33 is mounting the chips 6, the arrangement step (2) in FIG. 11A (the arrangement step (inversion and shaping) (2)-1 and the arrangement step (returning and elevating) (2)-2) is sequentially performed following the liquid level evening step (1) in FIG. 12A. Next, as is shown in FIG. 13A, when the second camera 35 has been retracted from the electronic component feeding unit 2, the mounting head 33 is moved to the electronic component feeding unit 2 and picks up the individual chips 6 to be mounted in the third turn. During the pickup operation, the first camera 34 is moved and positioned above the first substrate holding mechanism 10A of the substrate holder 10 to obtain images of the substrate 16. In this embodiment, the inspection of the states of the chips 6 mounted on the substrate 16 and the recognition of the electronic component mounting positions 16a, where the chips 6 are to be mounted during the next mounting turn, are performed.

Specifically, during the image obtaining process, as is shown in FIG. 14C, the first camera 34 is sequentially moved to fetch images, so that the eight electronic component mounting positions 16a set up for the substrate 16 are fitted in the image fetching ranges 18. Thereafter, the first camera 34 is retracted from the position above the substrate 16, and the first recognition processor 55 processes the images obtained by the first camera 34 and performs the following inspection process.

During the inspection process, for the images in the four image fetching ranges 18 on the left side, the mounting states of the chips 6 are examined, i.e., a check is performed to determine whether the positions and postures of the chips 6 are normal or shifted. For the four image fetching ranges 18 on the right, the electronic component mounting positions 16a of the substrate 16 are identified. In this embodiment, while the transfer step (pickup) (4)-1 is being performed, the substrate recognition step (6) (the substrate recognition step (mounting position recognition) (6)-1 and the substrate recognition step (mounting state inspection) (6)-2) are performed.

Thereafter, the processing is shifted to the operation in FIG. 13B. For this processing, as well as during the operation shown in FIG. 11B, the mounting step (extraction) (3)-1 is sequentially performed following the transfer step (relay) (4)-2, and thereafter, the unit steps are repetitively performed at the described timings.

As a result, as is shown in FIG. 14D, the chips 6 are mounted at the electronic component mounting positions 16a on the substrate 16, and as is shown in FIG. 14E, images of the four chips 6 on the right substrate 16 are obtained to examine their mounting states. The electronic component mounting operation for the substrate 16 is thereafter terminated.

As is described above, according to the electronic component mounting method in the first embodiment, by using the holding head 74 provided for the inversion unit 17, the array of the chips matching the array of the nozzles 33a of the mounting head 33 is arranged on the flux 80 of the inversion unit 17, and in addition, the coating with the flux of the bumps 6a and the flattening of the bumps 6a are performed.

As a result, during the flattening process, which is performed as part of the flux transfer process, the mounting head does not require a pressing mechanism to press the bumps against the flat face, and accordingly, does not need the strength required for the application of the necessary pressure. Therefore, the structure of the mounting head 33 can be simplified and its weight can be reduced, so that the speed of the mounting operation can be increased.

In addition, for the mounting operation, the flux transfer process, which is also performed as part of the flattening process by the holding head 74, and the mounting process performed by the mounting head 33 can be performed in parallel. Therefore, the tact time required for the mounting of the extracted components to be completed can be reduced, and the efficiency of the mounting operation can be improved.

Furthermore, in this embodiment, multiple nozzles 33a are provided for the mounting head 33, and to match this array of nozzles 33a, multiple chip holders 74a are provided for the holding head 74. Therefore, multiple chips 6 can be simultaneously transferred from the mounting head 33 to the holding head 74, and multiple chips 6 that the holding head 74 has positioned on the flux film 80a can be simultaneously extracted by the mounting head 33. Therefore, the time required for mounting the chips 6 using the mounting head 33 can be reduced and productivity can be improved. Further, when the shaping of the bumps 6a is not required, the pressing process (the shaping of the bumps 6a) at the arrangement step may be eliminated.

(Second Embodiment)

Figure 15:
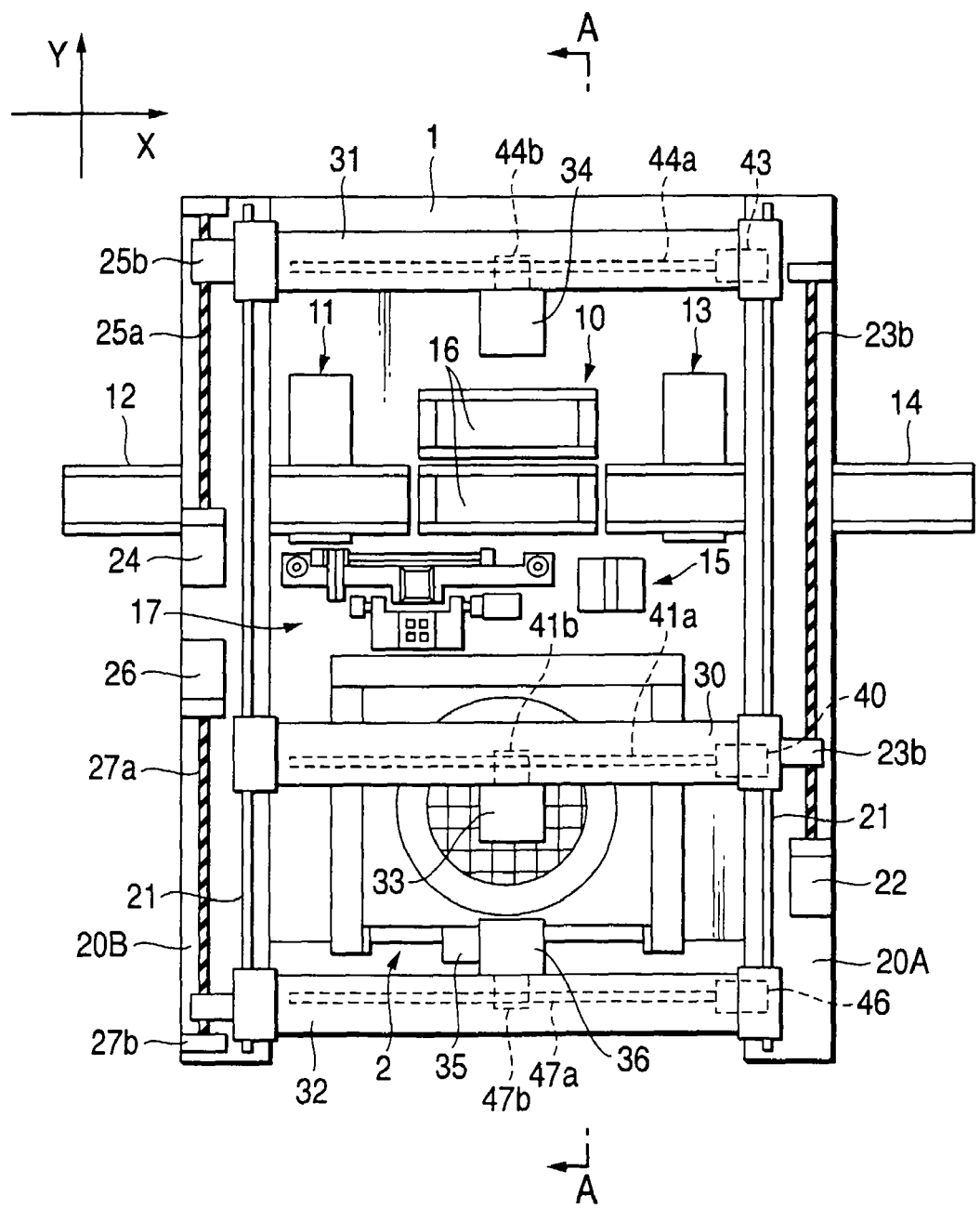
FIG. 15 is a plan view of an electronic component mounting apparatus according to a second embodiment of the invention.
Figure 16:
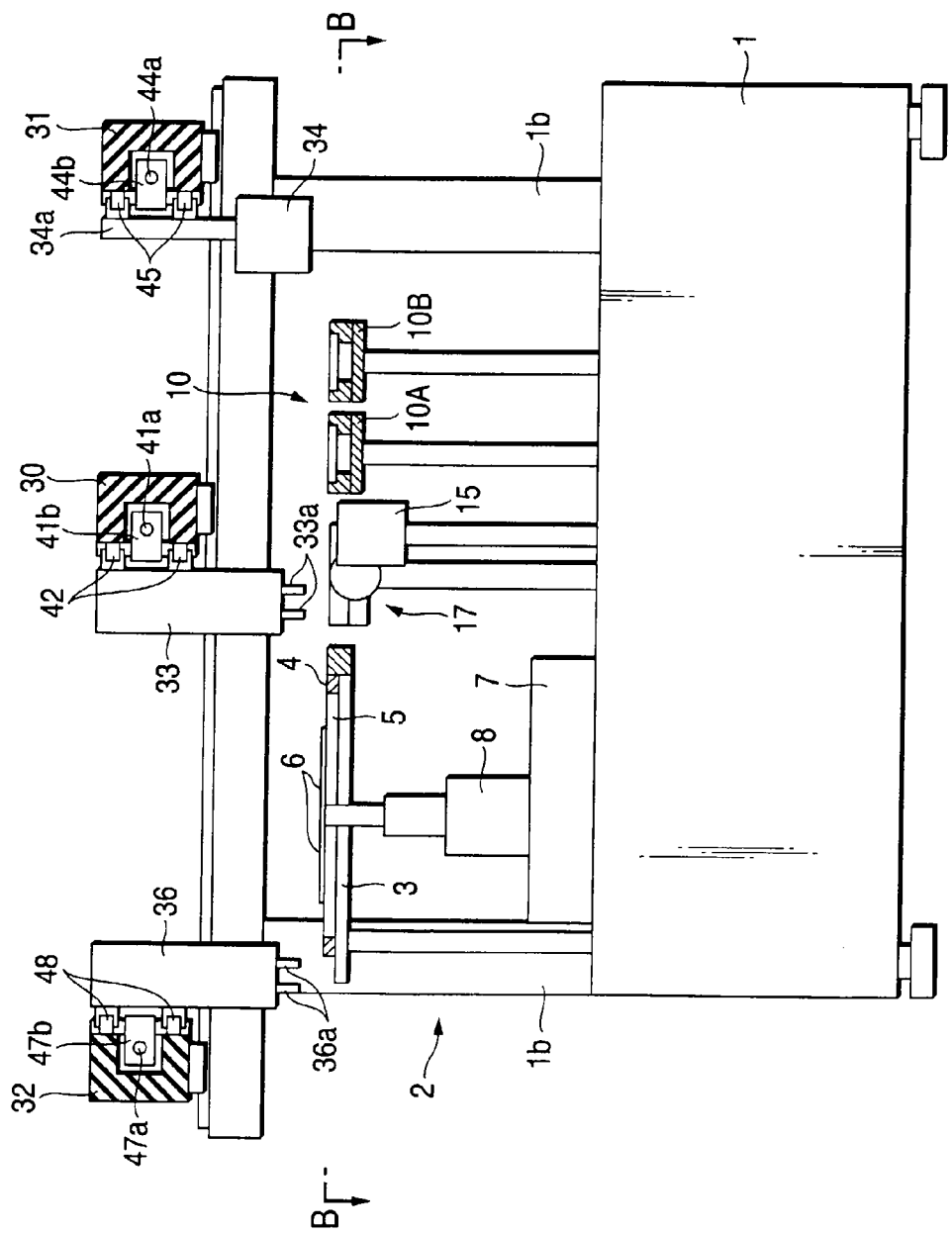
FIG. 16 is a side cross-sectional view of the electronic component mounting apparatus according to the second embodiment of the invention.
Figure 17:
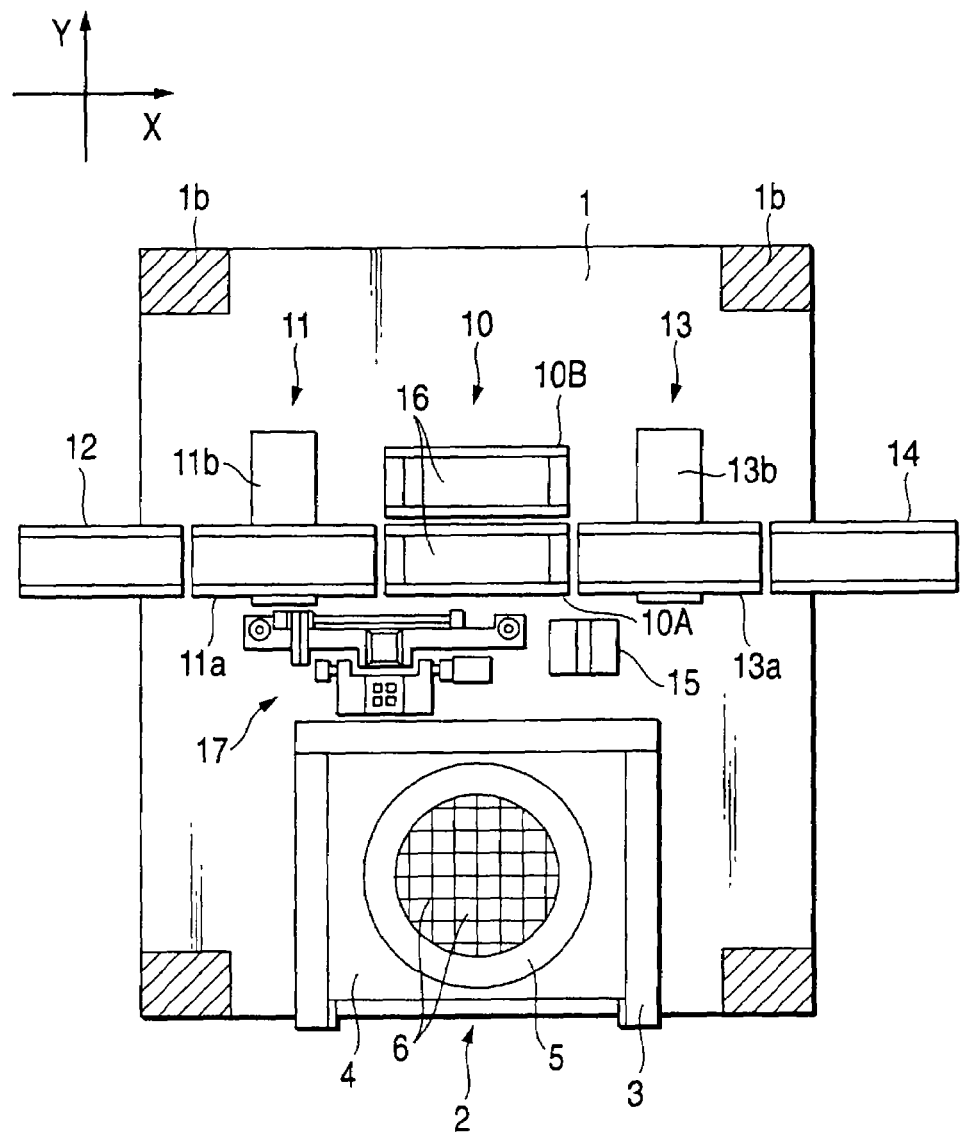
FIG. 17 is a plan cross-sectional view of the electronic component mounting apparatus according to the second embodiment of the invention.
Figure 18:
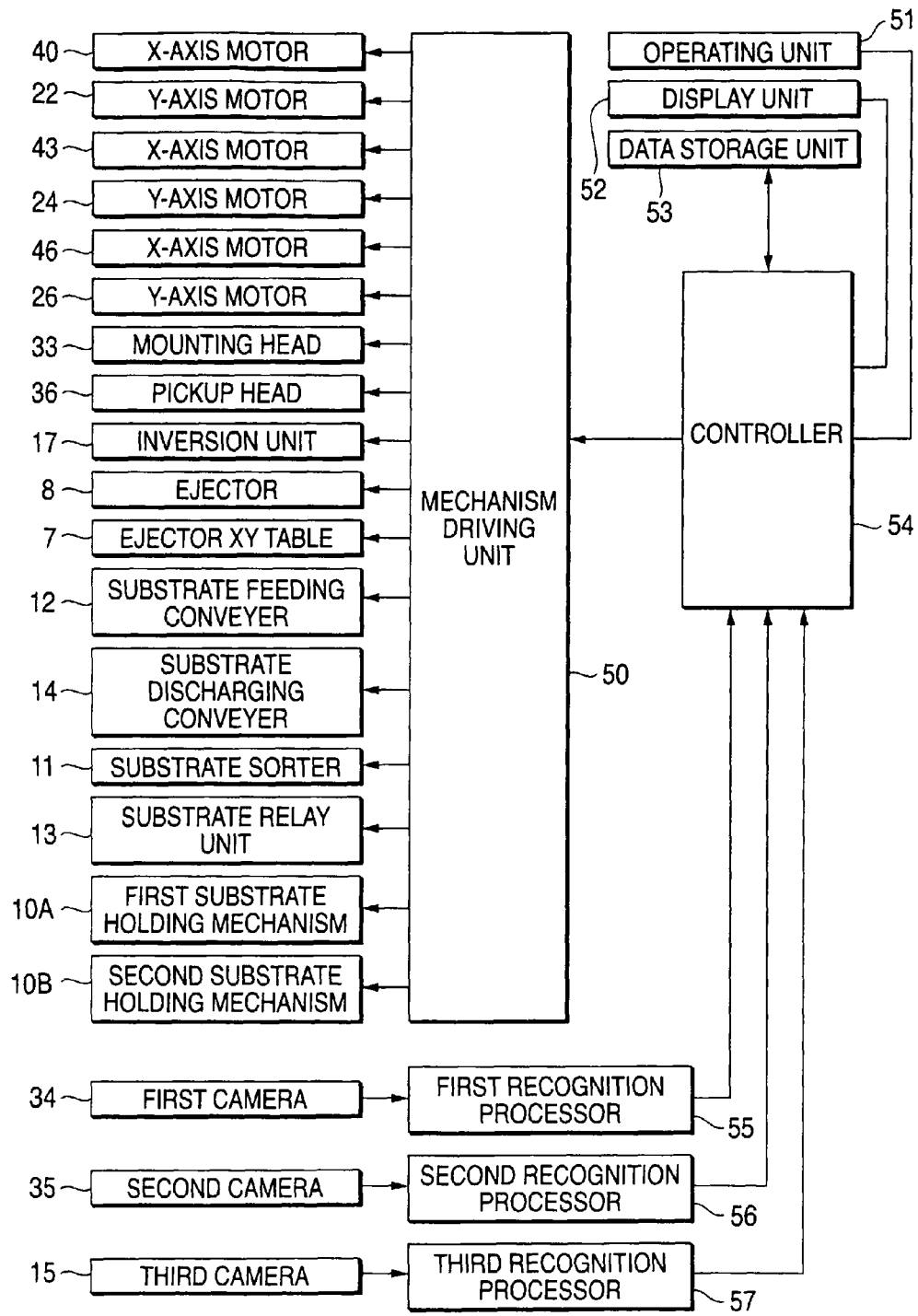
FIG. 18 is a block diagram showing the configuration of the control system of the electronic component mounting apparatus according to the second embodiment of the invention.
Figure 19:
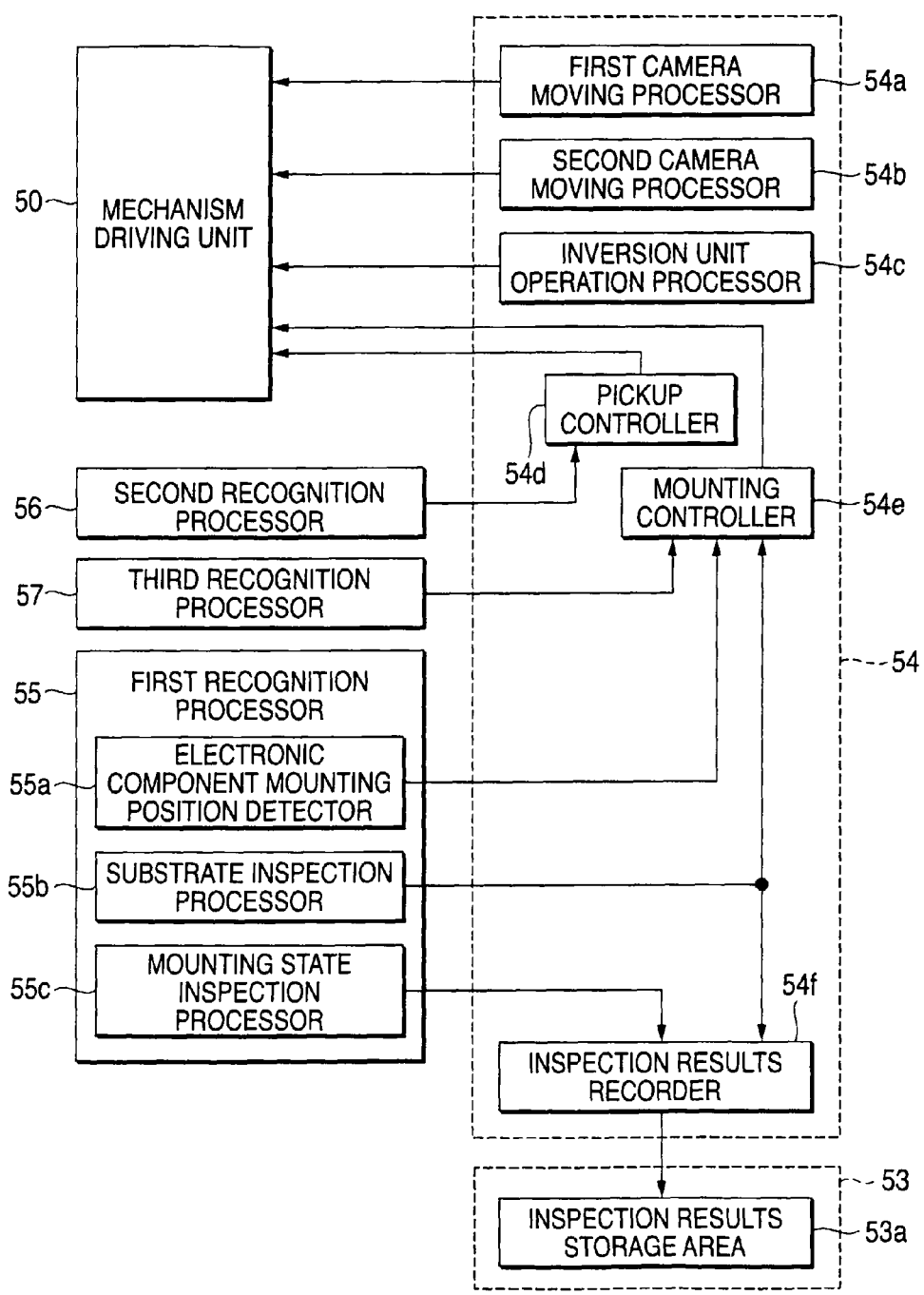
FIG. 19 is a functional block diagram showing the process functions of the electronic component mounting apparatus according to the second embodiment of the invention.
Figure 20:
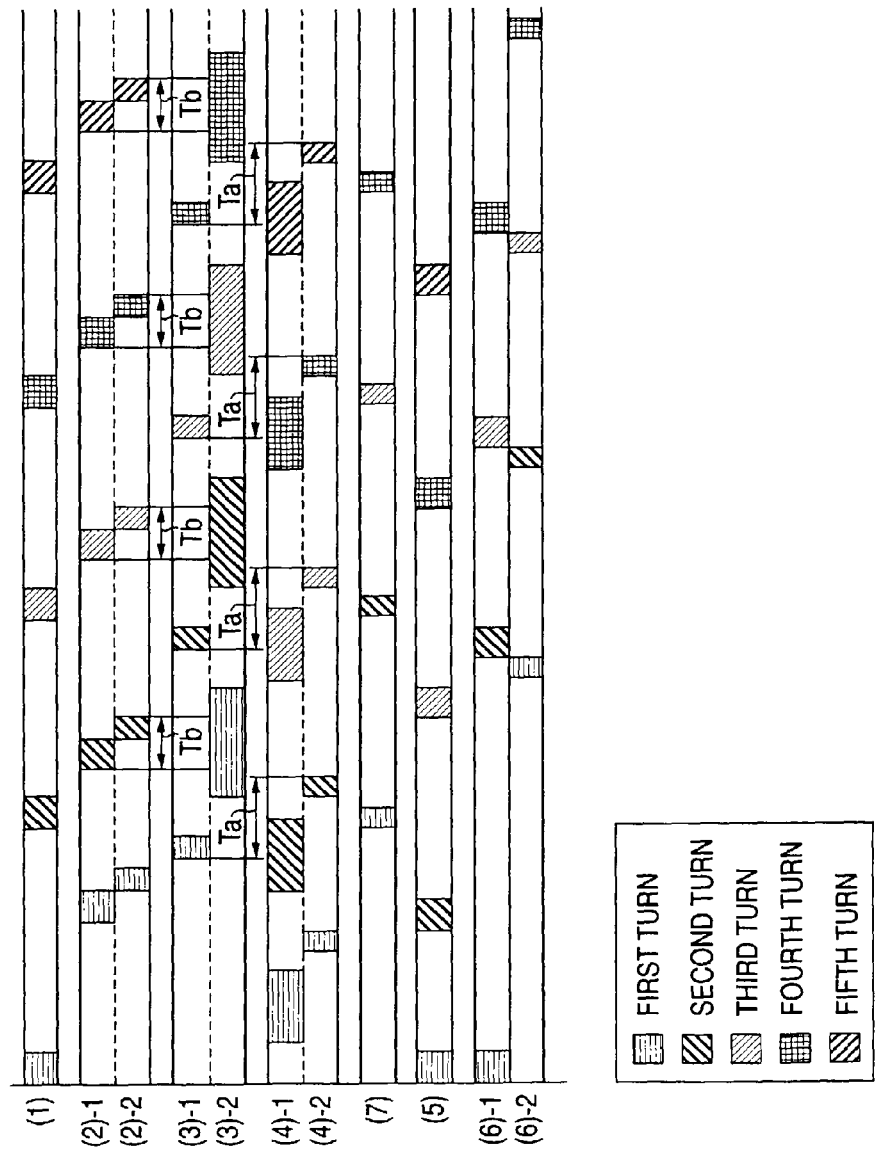
FIG. 20 is a timing chart showing an electronic component mounting method according to the second embodiment of the invention.
Figure 21:
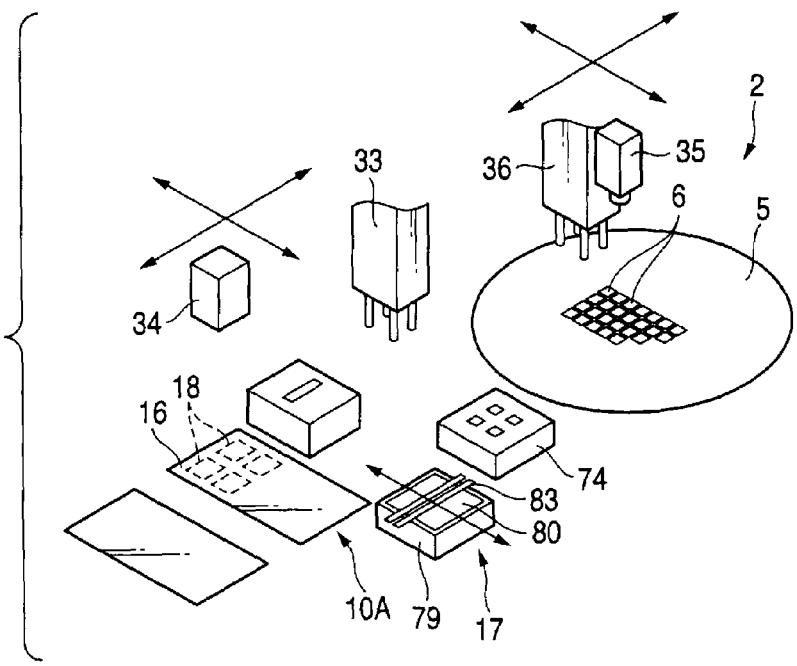
FIGS. 21A and 21B are diagrams for explaining the steps of the electronic component mounting method according to the second embodiment of the invention.
Figure 21:
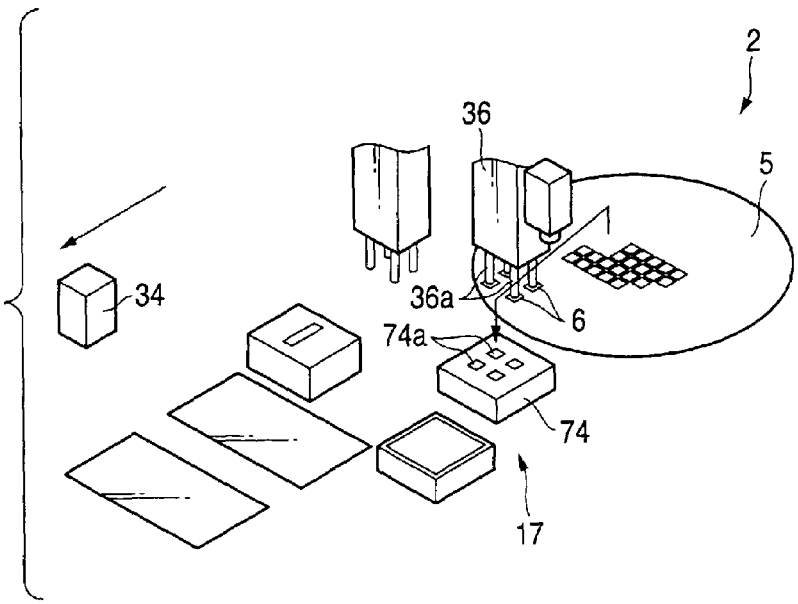
Figure 22:
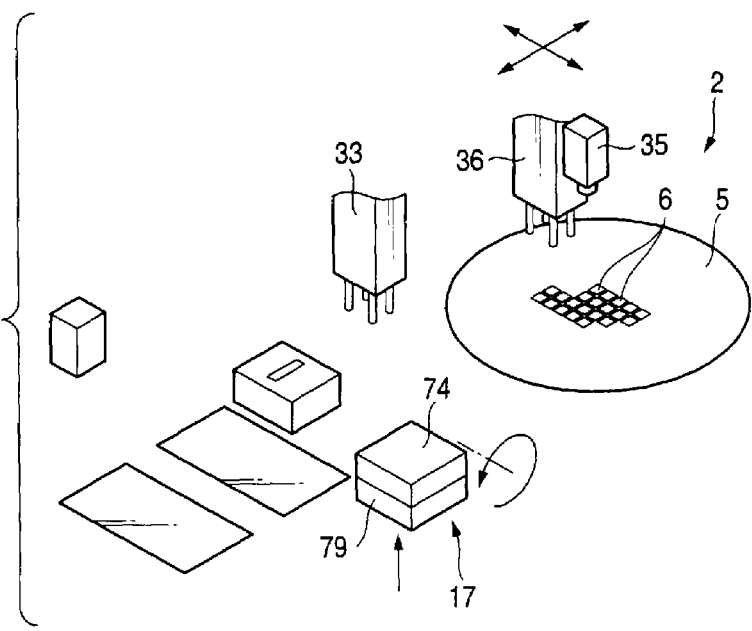
FIGS. 22A and 22B are diagrams for explaining the steps of the electronic component mounting method according to the second embodiment of the invention.
Figure 22:
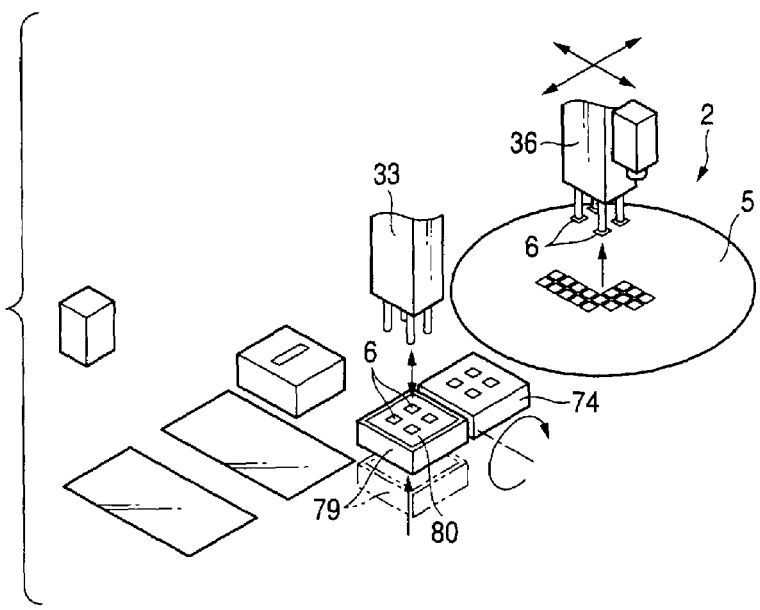
Figure 23:
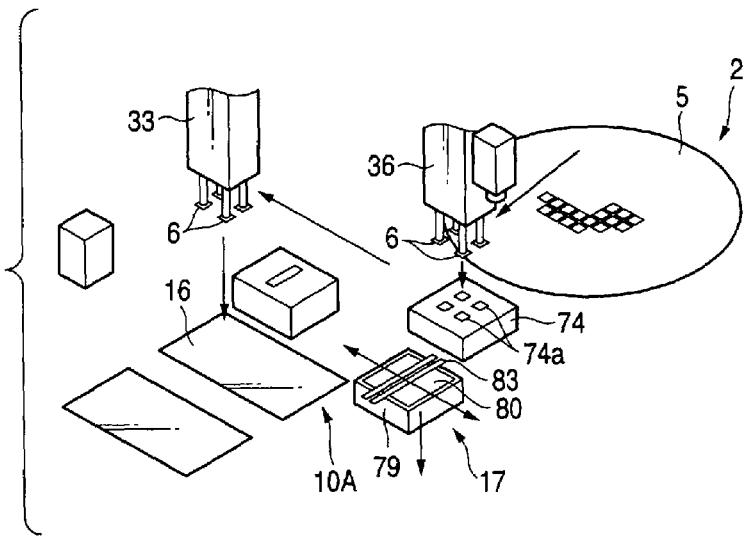
FIGS. 23A and 23B are diagrams for explaining the steps of the electronic component mounting method according to the second embodiment of the invention.
Figure 23:
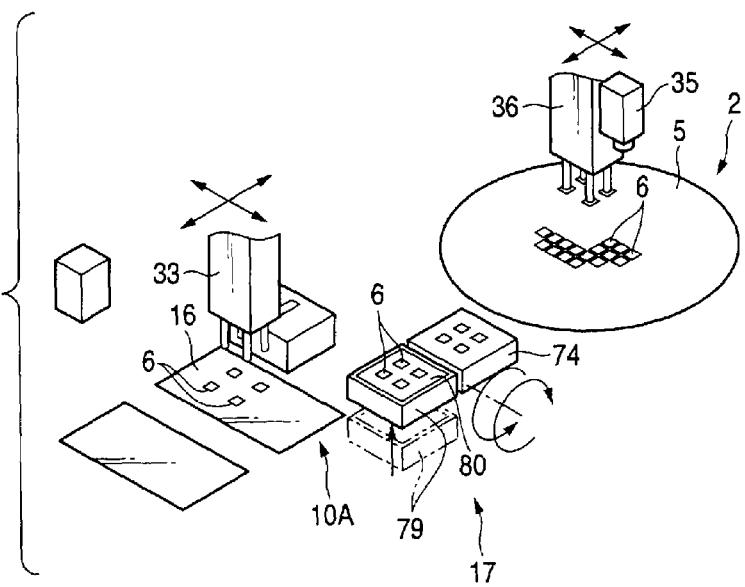
Figure 24:
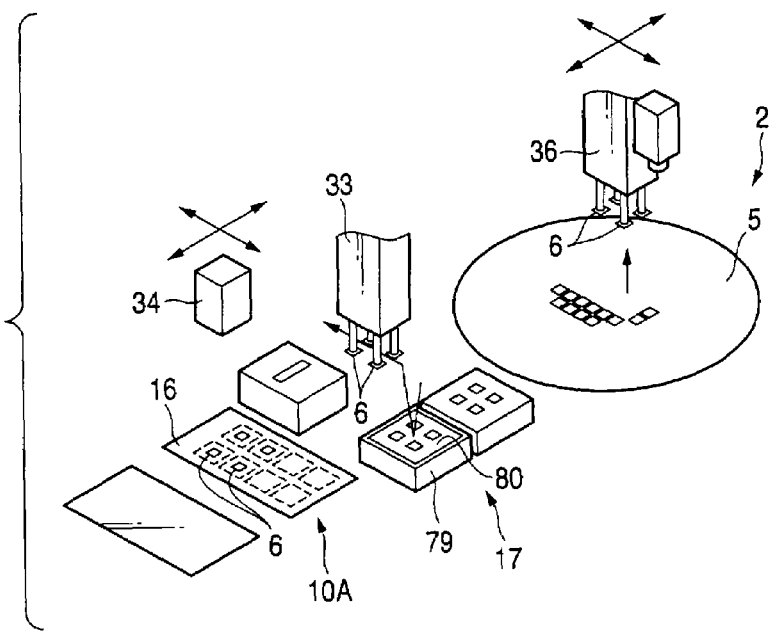
FIGS. 24A and 24B are diagrams for explaining the steps of the electronic component mounting method according to the second embodiment of the invention.
Figure 24:
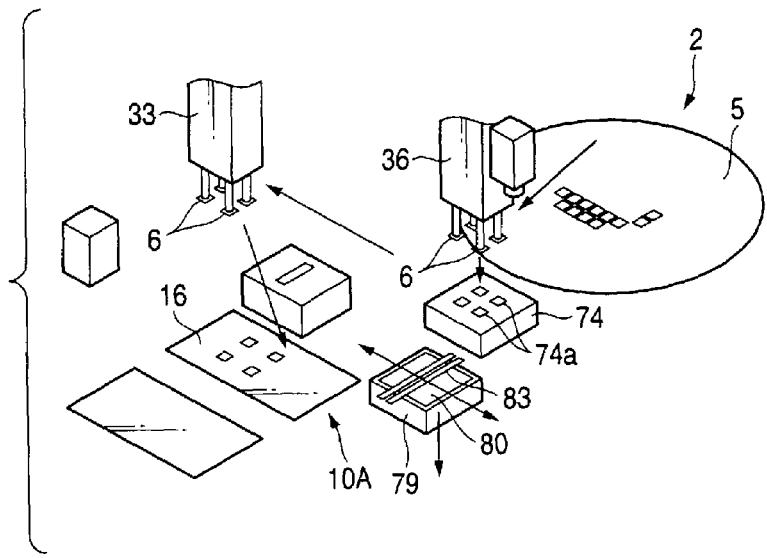

FIG. 15 is a plan view of an electronic component mounting apparatus according to a second embodiment of the invention. FIG. 16 is a side cross-sectional view of the electronic component mounting apparatus according to the second embodiment of the invention. FIG. 17 is a plan cross-sectional view of the electronic component mounting apparatus according to the second embodiment of the invention. FIG. 18 is a block diagram showing the configuration of the control system of the electronic component mounting apparatus according to the second embodiment of the invention. FIG. 19 is a functional block diagram showing the process functions of the electronic component mounting apparatus according to the second embodiment of the invention. FIG. 20 is a timing chart showing the electronic component mounting method according to the second embodiment of the invention. And FIGS. 21A to 21B, 22A to 22B, 23A to 23B, and 24A to 24B are diagrams for explaining procedural steps for an electronic component mounting method according to the second embodiment of the invention.

In the second embodiment, as well as in the first embodiment, a special head for picking up chips 6 from an electronic component feeding unit 2 is provided for an electronic component mounting apparatus, wherein through an inversion unit 17 chips 6, supplied by an electronic component feeding unit 2, are mounted on a substrate 16 held by a substrate holder 10. In the following explanation, to denote corresponding components, the same reference numerals are used as are used in the first embodiment, and no further explanation will be given for these components.

The overall configuration of the electronic component mounting apparatus will now be explained while referring to FIGS. 15, 16 and 17. The views in FIG. 16 and in FIG. 17 are respectively taken along a line A—A in FIG. 15 and a line B—B in FIG. 16. In FIG. 15, the electronic component feeding unit 2, the inversion unit 17, a third camera 15, the substrate holder 10, a substrate sorter 11 and a substrate relay unit 13, all of which have the same structure as those in the first embodiment, are arranged on a base anvil 1.

As in the first embodiment, three beam members move in the Y direction, and the first camera 34 and a mounting head 33 are respectively attached to a first beam 31 and a center beam 30, while a pickup head 36 is attached to a second beam 32. As is further shown in FIG. 15, a second camera 35 is integrally formed with the side face of the pickup head 36, which includes an array of nozzles (pickup nozzles) 36a that matches an array of nozzles 33a provided for the mounting head 33.

When a Y-axis motor 26 and an X-axis motor 46 are driven, the pickup head 36 and the second camera 35 are moved together, horizontally, in the X direction and the Y direction. Thus, the pickup head 36 employs the nozzles 36 to pick up chips 6 from the electronic component feeding unit 2, and transfers the chips 6 to a holding head 74, a part of the inversion unit 17. Further, the second camera 35 is moved and positioned above the electronic component feeding unit 2 to obtain images of the chips 6 held by the electronic component feeding unit 2.

A pair of Y-direction guides 21, the second beam 32, and the Y direction driving mechanism (the Y-axis motor 26, a feed screw 27a and a nut member 27b), which moves the second beam 32 along the Y-direction guides 21, and the X direction driving mechanism (the X-axis motor 46, a feed screw 47a and a nut member 47b), which moves the second camera 35 along second guides 48, constitute a pickup head moving mechanism that, together with the second camera 35, moves the pickup head 36 above the electronic component feeding unit 2. The pickup head 36 and the pickup head moving mechanism constitute pickup means for employing the nozzles 36a of the pickup head 36 to pick up chips 6 from the electronic component feeding unit 2, and for transferring the chips 6 to the holding head 74.

The configuration of the control system of the electronic component mounting apparatus will now be described while referring to FIG. 18. In FIG. 18, a mechanism driving unit 50 drives not only the sections described in the first embodiment, but also a mechanism for elevating the pickup head 36 and a component vacuum chuck mechanism that uses the nozzles 36a. The other sections are the same as those in the first embodiment.

The process functions of the electronic component mounting apparatus will now be described while referring to FIG. 19. In FIG. 19, of the function descriptions included in a block 54, the functions of a first camera moving processor 54a, an inversion unit operation processor 54c, a mounting controller 54e and an inspection results recorder 54f are the same as those for the first embodiment, and the process functions of the other processors are also the same as those in the first embodiment.

Under the control of the second camera moving processor 54b, the pickup head moving mechanism positions the second camera 35 in order to obtain images of the chips 6 on the electronic component feeding unit 2. Under the control of the pickup controller 54d, and based on the positions of the chips 6 obtained by a second recognition processor 56, the pickup head 36 and the pickup head moving mechanism position the pickup head 36 and elevate or drop the nozzles 36a in order to pick up the chips 6 from the electronic component feeding unit 2 and to transfer them to the holding head 74 of the inversion unit 17. The pickup controller 54d serves as pickup control means.

For the thus arranged electronic component mounting apparatus, an electronic component mounting method will now be described while referring to the timing chart in FIG. 20 and FIGS. 21A to 24B. In FIG. 20, as in FIG. 9 for the first embodiment, a time-series correlation is shown between the unit steps of the electronic component mounting operation. These unit steps are: a liquid level evening step (1), an arrangement step (2), a mounting step (3), a transfer step (4), a component recognition step (5), a substrate recognition step (6) and a component recognition step (7). Further, of these unit steps, the arrangement step (2), the mounting step (3), the transfer step (4) and the substrate recognition step (6) are divided into two sub-unit steps that are performed sequentially. Unit steps other than the transfer step (4) are the same as those in the first embodiment.

The transfer step (4) is a step of using the pickup head 36 to pick up chips 6 from the electronic component feeding unit 2, and of transferring the chips 6 to the holding head 74, and includes the following two sub steps. A transfer step (pickup) (4)-1 is a step of using the nozzles 36a of the pickup head 36 to pick up individual chips 6, which are supplied by the electronic component feeding unit 2, while the bump formation faces are directed upward (see FIG. 10B).

A transfer step (relay) (4)-2 is a step of relaying the chips 6 picked up from the electronic component feeding unit 2, while the reverse faces of the chips 6 are held by the chip holders 74a on the holding head 74 (see FIG. 11B). In this case, a plurality of the chips 6 are simultaneously transferred from the nozzles 36a of the pickup head 36 to the holding head 74. The transfer step (4)-2 serves as an electronic component holding step of holding the chips 6 on the holding head 74, while the chip holders 74a are facing up.

The electronic component mounting method will now be described while referring to the time-series correlation between the unit steps. In FIG. 21A, multiple chips 6 are glued to an adhesive sheet 5 of a jig 4 held by the electronic component feeding unit 2, while the bump formation faces are directed upward. The substrate 16 is positioned by a first substrate holding mechanism 10A and a second substrate holding mechanism 10B of the substrate holder 10.

Initially, a first turn is begun. As is shown in FIG. 21A, the second camera 35, together with the pickup head 36, is moved and positioned above the electronic component feeding unit 2, and obtains images of the chips 6 to be mounted in the first turn to identify their locations. At this time, the first camera 34 is moved and positioned above the substrate 16 held by the first substrate holding mechanism 10A, and procures images by sequentially obtaining images of multiple electronic component mounting positions 16a. The images obtained by the first camera 34 are then processed to obtain the electronic component mounting positions on the substrate 16.

Parallel to this processing, a squeegee process is performed for the inversion unit 17, i.e., a squeegee unit 83 spreads a flux 80 across a stage 79 to deposit a flux film 80a. That is, in this embodiment, the component recognition step (5), the substrate recognition step (mounting position recognition) (6)-1 and the liquid level evening step (1) are performed in parallel (see FIG. 20).

Next, based on the positions obtained for the chips 6, the pickup head 36 is sequentially positioned above these chips 6, and uses the four nozzles 36a to pick up the chips 6. Then, as is shown in FIG. 21B, the pickup head 36 is moved and positioned above the holding head 74, and transfers the chips 6 it is holding to the chip holders 74a. That is, in this case, the transfer step (relay) (4)-2 is performed after the transfer step (pickup) (4)-1.

Following this, as is shown in FIG. 22A, the second camera 36, together with the pickup head 36, is moved and positioned above the electronic component feeding unit 2, and obtains images of chips 6 to be mounted in the second turn in order to obtain their positions. Parallel to this process, the holding head 74 in the inversion unit 17, whereat the chips 6 are received, is vertically inverted relative to a stage 79 that was lowered to the transfer height position after the flux film 80a was deposited at the liquid level evening step (1). Thus, as in the first embodiment, bumps 6a on the chips held by the holding head 74 are brought into contact with a bottom face 79a of the stage 79, and the distal ends of the bumps 6a are shaped and flattened. That is, in this case, the component recognition step (5) and the arrangement step (inversion and shaping) (2)-1 are performed in parallel.

Sequentially, as is shown in FIG. 22B, the pickup head 36 picks up, from the electronic component feeding unit 2, the individual chips 6 to be mounted in the second turn. Parallel to this process, in the inversion unit 17, a vacuum chuck process, employing through vacuum holes 74b of the holding head 74, is halted, and the holding head 74 is returned to the original position while the stage 79 is elevated to the relay height position. Thereafter, the mounting head 33 extracts the chips 6 from the stage 79. In this case, while the transfer step (pickup) (4)-1 is being performed, the arrangement step (returning and elevating) (2)-2 and the mounting step (extraction) (3)-1 are performed in the named order.

Next, as is shown in FIG. 23A, after the mounting head 33 has extracted the chips 6 from the stage 79, the mounting head 33 performs scanning by moving above the third camera 15, and is then moved and positioned above the substrate 16 held by the first substrate holding mechanism 10A. The chip images obtained by the scanning are fetched is to identify the positions of the chips 6.

Parallel to this processing, the squeegee process is performed in the inversion unit 17, i.e., the squeegee unit 83 spreads the flux 80 across the stage 79 to deposit the flux film 80a. Then, the pickup head 36 that has picked up the chips 6 from the electronic component feeding unit 2 is moved and positioned above the holding head 74, and transfers the chips 6 to the holding head 74. In this case, the component recognition step (before mounting) (7) and the liquid level evening step (1) are performed in parallel, and then, the transfer step (relay) (4)-2 is performed.

Thereafter, as is shown in FIG. 23B, the mounting head 33 mounts the chips 6 on the substrate 16. While the mounting head 33 is mounting the chips 6, the same arrangement step (inversion and shaping) (2)-1 as is shown in FIG. 22A and the same arrangement step (returning and elevating) (2)-2 as is shown in FIG. 22B are performed for the inversion unit 17. Further, the second camera 35 obtains images of the chips 6 that are fed by the electronic component feeding unit 2 for mounting in the third turn, and obtains their positions. In this case, the mounting step (mounting) (3)-2, the component recognition step (5), the arrangement step (2) (the arrangement step (inversion and shaping) (2)-1 and the arrangement step (returning and elevating) (2)-2) are performed in parallel.

Following this, as is shown in FIG. 24A, the pickup head 36 picks up, from the electronic component feeding unit 2, the individual chips 6 to be mounted in the third turn. Parallel to this, the mounting head 33 extracts the chips 6 from the stage 79 of the inversion unit 17. Then, the first camera 34 is moved and positioned above the first substrate holding mechanism 10A of the substrate holder 10, and obtains images of the substrate 16. Based on the obtained image, the states of the chips 6 that were mounted in the first turn are examined, and the electronic component mounting positions 16a, whereat the chips 6 are to be mounted in the second turn, are identified. In this case, the mounting step (extraction) (3)-1 and the transfer step (pickup) (4)-1 are performed parallel to the substrate recognition step (mounting position recognition) (6)-1 and the substrate recognition step (mounting state inspection) (6)-2, which are performed sequentially.

Then, as is shown in FIG. 24B, the mounting head 33, which has extracted the chips 6 from the stage 79, performs scanning by moving above the third camera 15, and is then moved and positioned above the substrate 16 held by the first substrate holding mechanism 10A. The images of the chips 6 obtained by the scanning are fetched to identify their locations, and the chips 6 are mounted on the substrate 16. At this time, the pickup head 36 transfers, to the holding head 74, the chips 6 picked up from the electronic component feeding unit 2. In this case, the mounting step (mounting) (3)-2 and the transfer step (relay) (4)-2 are performed in parallel.

That is, according to the electronic component mounting method, since the chips 6 fed by the electronic component feeding unit 2 are picked up by the pickup head 36, which can be provided and operated separately from the mounting head 33, the mounting head 33 need only mount the chips 6 on the substrate 16.

Therefore, when the arrangement step (returning and elevating) (2)-2 is completed, the process can be immediately shifted to the mounting step (extraction) (3)-1. Therefore, compared with the configuration in the first embodiment, i.e., the system wherein the mounting head 33 performs both the process for picking up the chips 6 from the electronic component feeding unit 2 and the process for mounting on the substrate 16 the chips 6 extracted from the stage 79, the tact time for the one mounting turn can be reduced by a length of time equivalent to the time indicated by an arrow Ta in FIG. 20.

Furthermore, the arrangement step (2) for the inversion unit 17 can be performed regardless of the operation of the mounting head 33, so long as the liquid level evening step (1), which is performed after the mounting step (extraction) (3)-1, and the transfer step (relay) (4)-2 are completed. Therefore, compared with the tact time required for the mounting operation in the first embodiment, i.e., the tact time required both for the operation of the mounting head 33 and for the arrangement step (2) performed in a time series, the tact time for the first mounting turn can be reduced even more by a length of time equivalent to the time indicated by an arrow Tb in FIG. 20. In this embodiment, when the bumps 6a need not be shaped, the pressing process at the arrangement step (shaping of the bumps 6a) may be eliminated.

(Third Embodiment)

Figure 25:
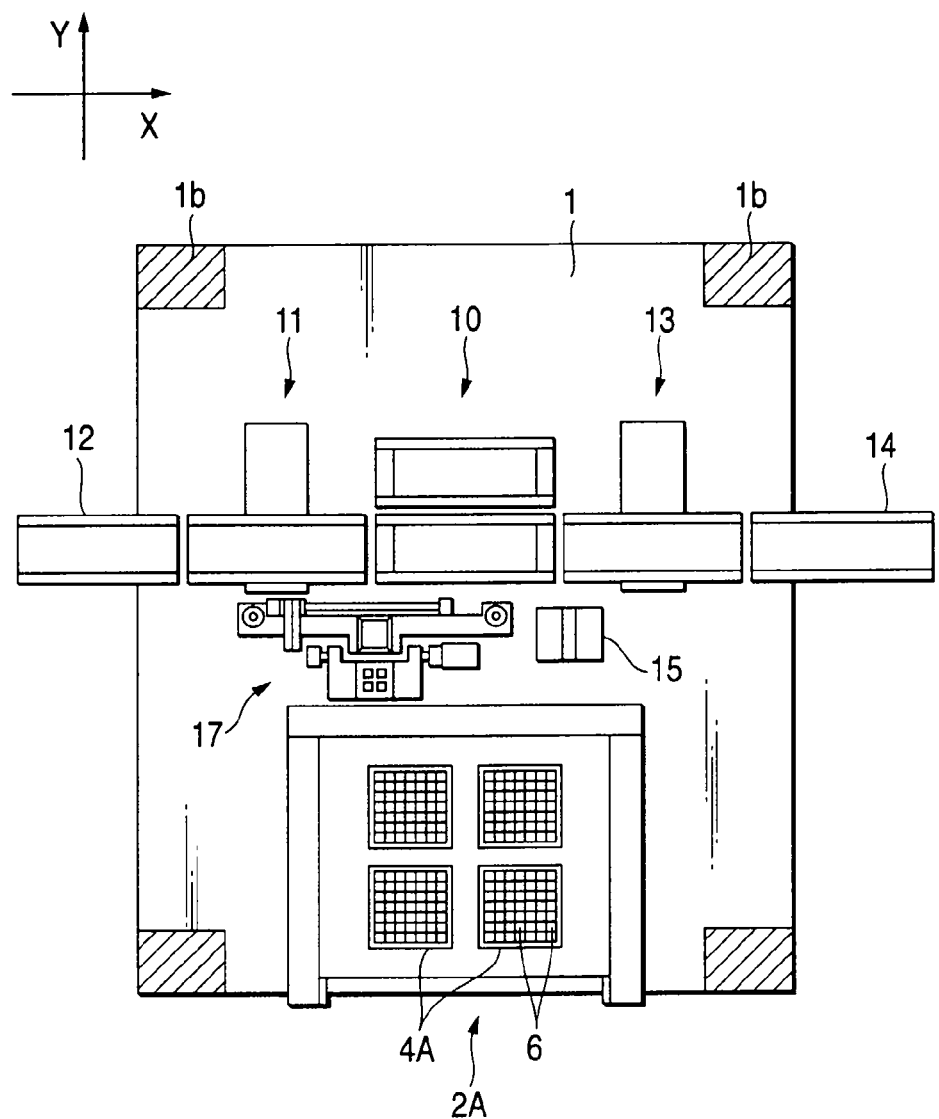
FIG. 25 is a plan cross-sectional view of an electronic component mounting apparatus according to a third embodiment of the invention.
Figure 26:
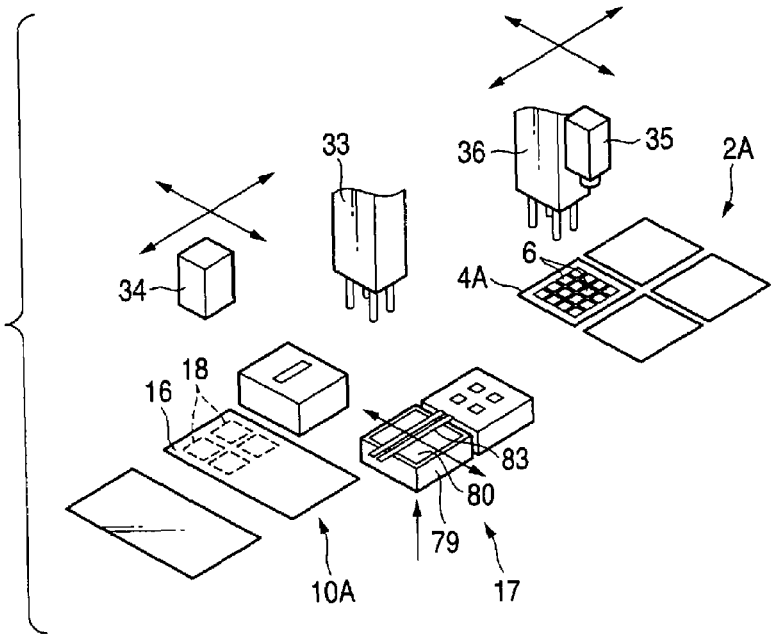
FIGS. 26A and 26B are diagrams for explaining the steps of an electronic component mounting method according to the third embodiment of the invention.
Figure 26:
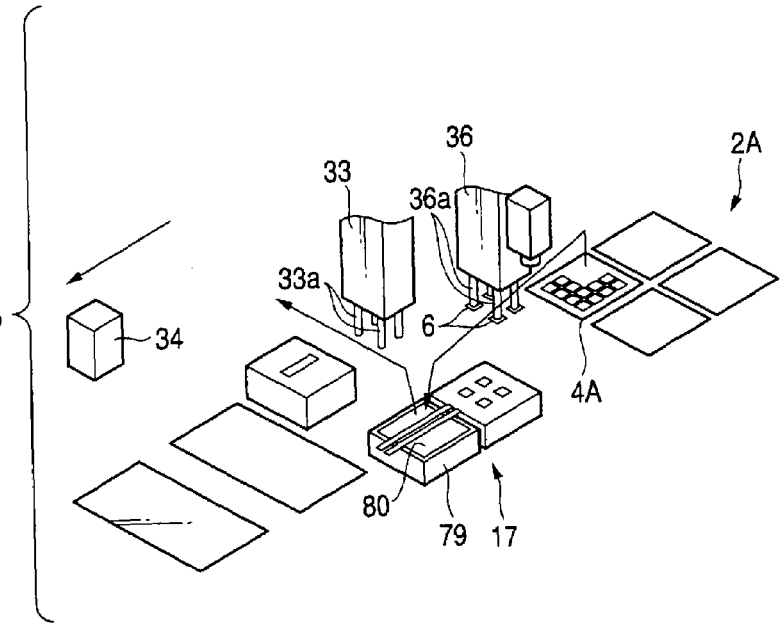

FIG. 25 is a plan cross-sectional view of an electronic component mounting apparatus according to a third embodiment of the present invention, and FIGS. 26A and 26B are diagrams for explaining the procedural steps for an electronic component mounting method according to the third embodiment. In the third embodiment, for the electronic component mounting apparatus in the second embodiment, the electronic component feeding unit 2 for supplying the chips 6 attached to the adhesive sheet 5 is replaced with a unit for supplying chips that are retained in a tray in the face-down state, wherein the bump formation face is directed downward.

In the plan view in FIG. 25 for the electronic component mounting apparatus, an inversion unit 17, a third camera 15, a substrate holder 10, a substrate sorter 11 and a substrate relay unit 13, all of which have the same structures as those in the first embodiment, are provided on a base anvil 1, and an electronic component feeding unit 2A is provided in front of the inversion unit 17. Components other than the electronic component feeding unit 2A are the same as those as shown for the second embodiment.

Multiple trays 4A are arranged for the electronic component feeding unit 2A, and chips 6, whereon bumps 6a are formed, are retained in the trays 4A with the bump formation faces directed downward. The chips 6 in the trays 4A are picked up by a pickup head 36, such as is used in the second embodiment, and are directly transmitted to a stage 79 of the inversion unit 17, without a holding head 74 being used.

This operation will now be described while referring to FIGS. 26A and 26B. In FIG. 26A, images of the chips 6 in the trays 4A of the electronic component feeding unit 23A are obtained by a second camera 35, as done in the second embodiment, and the positions of the chips 6 are obtained. Based on the obtained positions, the pickup head 36 vacuum chucks the chips 6 on the faces opposite those used for bump formation, and picks up the chips 6.

The squeegee operation is performed for the inversion unit 17, i.e., a squeegee unit 83 spreads a flux 80 across the stage 79 to deposit a flux film 80a, and the stage 79 is elevated to a position where a mounting head 33 can extract the chips 6. The first camera 34 is moved and positioned above a substrate 16, which is held by a first substrate holding mechanism 10A of the substrate holder 10, and sequentially obtains images of electronic component mounting positions 16a for position recognition.

Following this, as is shown in FIG. 26B, the pickup head 36, which uses nozzles 36a to hold the chips 6, is moved to a position above the stage 79 of the inversion unit 17 and, while the bump formation faces are directed downward, arranges the chips 6 on the even liquid face of the flux 80 formed on the stage 79. As a result, an array of the chips 6 is provided on the stage 79 that corresponds to the array of nozzles 33a on the mounting head 33.

Therefore, in the third embodiment, the arrangement means for arranging the chips 6 includes the pickup head 36, which employs the nozzles (pickup nozzles) 36a to vacuum-chuck the reverse faces of the chips 6 fed by the electronic component feeding unit 2A and which picks up and arranges the chips 6 on the flux 80a deposited on the stage 79.

When the pickup head 36 is retracted from the position above the stage 79, the mounting head 33 is moved and positioned above the stage 79, from which it extracts the chips 6. Thereafter, in the same manner as in the first embodiment, the mounting head 33 is moved above the third camera 15, and images of the chips 6 are obtained to identify their locations. Then, the mounting head 33 is moved and positioned above the substrate 16, held by the substrate holder 10, and mounts the individual chips 6 on the substrate 16.

In the third embodiment, one of the following two methods can be employed to shape the bumps 6a. According to the first method, when the chips 6 picked up by the pickup head 36 are arranged on the stage 79, the chips 6 are pressed against the stage 79 by the pickup head 36, and to shape the bumps 6a, they are forced against a bottom face 79a of the stage 79. In this case, when the pressurization mechanism for the pickup head 36 is incorporated, the bumps 6a can be shaped more accurately.

According to a second method, the inversion unit 17 is employed for shaping. When the chips 6 are arranged on the stage 79, the holding head 74 is inverted and brought in contact with the reverse faces of the chips 6 on the stage 79. Then, to shape the bumps, they are pressed against the bottom face 79a of the stage 79 by an elevating actuator 84.

According to the present invention, an electronic component picked up from an electronic component feeding unit is arranged on viscous liquid spread across a flat stage, so that bumps on the electronic component are covered with the viscous liquid, and the electronic component on the viscous liquid is extracted by the mounting head and is mounted on a work. As a result, the use of a mounting head to apply the coating of the viscous liquid can be eliminated, and the working efficiency can be improved.

What is claimed is:

1. An electronic component mounting apparatus, for applying viscous liquid to multiple projecting electrodes formed on a projecting electrode formation face of an electronic component, and for mounting the electronic component on a work, comprising:
   a viscous liquid supply unit for supplying the viscous liquid that is spread out and evenly distributed during a flattening stage;
   an arrangement means including an inversion unit for holding, inversion, and arranging the electronic component on the evenly distributed viscous liquid while the projecting electrodes continue to contact the viscous liquid;
   a mounting unit having a mounting head that includes a mounting nozzle and used for the vacuum chucking of the electronic component, said mounting unit for extracting the electronic component arranged on the viscous liquid using the mounting nozzle and for mounting the electronic component on the work;
   an electronic component recognition unit having a camera for obtaining images of the electronic component held by the mounting nozzle, for employing an image obtained by the camera to identify the location of the electronic component; and
   a mounting controller for controlling the mounting unit based on the recognition results obtained by the electronic component recognition unit, and for positioning, on the work, the electronic component held by the mounting nozzle.

2. The electronic component mounting apparatus according to claim 1, further comprising:
   a squeegee for spreading out and leveling the viscous liquid on the stage.

3. An electronic component mounting apparatus, for applying viscous liquid to multiple projecting electrodes formed on a projecting electrode formation face of an electronic component, and for mounting the electronic component on a work, comprising:
   a viscous liquid supply unit for supplying the viscous liquid that is spread out and evenly distributed during a flattening stage;
   an arrangement means for arranging the electronic component on the evenly distributed viscous liquid while the projecting electrodes continue to contact the viscous liquid;
   a mounting unit having a mounting head that includes a mounting nozzle and used for the vacuum chucking of the electronic component, said mounting unit for extracting the electronic component arranged on the viscous liquid using the mounting nozzle and for mounting the electronic component on the work;
   an electronic component recognition unit having a camera for obtaining images of the electronic component held by the mounting nozzle, for employing an image obtained by the camera to identify the location of the electronic component; and
   a mounting controller for controlling the mounting unit based on the recognition results obtained by the electronic component recognition unit, and for positioning, on the work, the electronic component held by the mounting nozzle,
   wherein the arrangement means includes a holding head for holding the electronic component, from the reverse face thereof, while the projecting electrode formation face is directed upward, wherein the holding head is vertically inverted relative to the stage, and the electronic component held by the holding head is placed on the viscous liquid.

4. The electronic component mounting apparatus according to claim 3, further comprising:
   a pressurization mechanism for pressing the projecting electrodes on the electronic component, held by the holding head, against the stage and flattening the distal ends of the projecting electrodes.

5. The electronic component mounting apparatus according to claim 3, further comprising:
   an electronic component feeding unit for feeding the electronic component, with the projecting electrode formation face directed upward,
   wherein, by using the mounting nozzle of the mounting head, the electronic component is acquired from the electronic component feeding unit and is transmitted to the holding head.

6. The electronic component mounting apparatus according to claim 3, further comprising:
   an electronic component feeding unit for feeding an electronic component with the projecting electrode formation face directed upward; and
   a pickup unit for employing a pickup nozzle for a pickup head to acquire the electronic component from the electronic component feeding unit, and for transmitting the electronic component to the holding head.

7. The electronic component mounting apparatus according to claim 1, further comprising:
   an electronic component feeding unit for feeding an electronic component with the projecting electrode formation face directed downward,
   wherein the arrangement means includes a pickup head for acquiring the electronic component from the electronic component feeding unit by vacuum chucking the reverse face of the electronic component using a pickup nozzle, and for placing the electronic component on the viscous liquid.

8. An electronic component mounting method, for applying viscous liquid to multiple projecting electrodes formed on a projecting electrode formation face of an electronic component, and for mounting the electronic component on a work, comprising:
   a liquid level evening step of spreading out and leveling the viscous liquid on a flat stage;
   a holding step to hold the electronic component with the projecting electrodes in an upward direction;
   an inversion step to invert the electronic component so the electrodes contact the viscous liquid;
   an extraction step of separating the electronic component from the viscous liquid by vacuum chucking using a mounting nozzle of a mounting head;
   a component recognition step of using a camera to obtain images of the electronic component held by the mounting nozzle, and of employing the obtained images to identify the location of the electronic component; and
   a mounting step, based on the recognition results obtained at the component recognition step, of moving the mounting head in order to position the electronic component on a work, and of mounting the electronic component on the work.

9. The electronic component mounting method according to claim 8,
wherein, at the liquid level evening step, the viscous liquid is spread out and leveled on the stage using a squeegee.

10. An electronic component mounting method, for applying viscous liquid to multiple projecting electrodes formed on a projecting electrode formation face of an electronic component, and for mounting the electronic component on a work, comprising:
a liquid level evening step of spreading out and leveling the viscous liquid on a flat stage;
an arrangement step of arranging the electronic component on the viscous liquid having an even liquid level, while the projecting electrodes contact the viscous liquid;
an extraction step of separating the electronic component from the viscous liquid by vacuum chucking using a mounting nozzle of a mounting head;
a component recognition step of using a camera to obtain images of the electronic component held by the mounting nozzle, and of employing the obtained images to identify the location of the electronic component; and
a mounting step, based on the recognition results obtained at the component recognition step, of moving the mounting head in order to position the electronic component on a work, and of mounting the electronic component on the work,
wherein, at the arrangement step, the holding head by which the reverse face of the electronic component is vacuum-chucked while the projecting electrode formation face is directed upward, is vertically inverted relative to the stage, so that the electronic component held by a holding head can be placed on the viscous liquid having an even liquid level.

11. The electronic component mounting method according to claim 10,
wherein, when the electronic component held by the holding head is arranged on the viscous liquid having the even liquid level, the projecting electrodes on the electronic component are pressed against the stage to flatten the distal ends of the projecting electrodes.

12. The electronic component mounting method according to claim 10, further comprising:
a step of using the mounting head to acquire and move the electronic component from the electronic component feeding unit, which feeds the electronic component with the projecting electrode formation face directed upward, and of transferring the electronic component to the holding head.

13. The electronic component mounting method according to claim 10, further comprising:
a transfer step of using a pickup nozzle of a pickup head to pick up and move the electronic component from the electronic component feeding unit, which feeds the electronic component with the projecting electrode formation face directed upward, and of transferring the electronic component to the holding head.

14. The electronic component mounting method according to claim 7,
wherein, at the arrangement step, while the reverse face of the electronic component is vacuum-chucked by the pickup head, the electronic component is separated from the electronic component feeding unit that feeds the electronic component with the projecting electrode formation face directed downward; and whereby the electronic component held by the pickup head is placed on the viscous liquid having the even liquid level.

15. An electronic component mounting apparatus, for applying viscous liquid to multiple projecting electrodes formed on a projecting electrode formation face of an electronic component, and for mounting the electronic component on a work, comprising:
an electronic component feeding unit for feeding multiple electronic components with the projecting electrode formation faces directed upward;
a viscous liquid supply unit for supplying the viscous liquid that is spread out and evenly distributed during a flat stage;
an inversion unit for holding, inverting, and arranging the electronic component on the evenly distributed viscous liquid while the projecting electrodes continue to contact the viscous liquid;
a mounting unit having a mounting head that includes mounting nozzles and used for the vacuum chucking of the electronic components, said mounting unit for extracting the electronic components arranged on the viscous liquid using the mounting nozzles and for mounting the electronic components on a work;
an electronic component recognition unit having a camera for obtaining images of the electronic components held by the mounting nozzles, for employing an image obtained by the camera to identify the locations of the electronic components; and
a mounting controller for controlling the mounting unit based on the recognition results obtained by the electronic component recognition unit, and for positioning, on the work, the electronic components held by the mounting nozzles.

16. The electronic component mounting apparatus according to claim 15,
wherein the array of the mounting nozzles of the mounting heads matches the array of electronic component holders of the holding head.

17. The electronic component mounting apparatus according to claim 15,
wherein the flat stage is large enough to arrange, on the viscous liquid, the multiple electronic components held by the holding head.

18. An electronic component mounting method, for applying viscous liquid to multiple projecting electrodes formed on a projecting electrode formation face of an electronic component, and for mounting the electronic component on a work, comprising:
a transfer step of using multiple mounting nozzles of a mounting head to pick up multiple electronic components supplied with the projecting electrode formation faces directed upward, and transferring the electronic components while the reverse faces thereof are held by electronic component holders of the holding head;
a coating step of inverting and arranging, on the viscous liquid spread on a flat stage, the electronic components held by the holding head, and applying the viscous liquid on the projecting electrodes of the electronic components; and
a mounting step of employing the mounting nozzles of the mounting head to remove the multiple components from the flat stage and to mount the electronic components on a work.

19. The electronic component mounting method according to claim 18, wherein, at the transfer step, the multiple electronic components are transferred at the same time from the mounting nozzles of the mounting head to the holding head; and whereby, at the mounting step, the multiple electronic components are removed at the same time from the flat stage using the mounting nozzles.

20. The electronic component mounting method according to claim 18, wherein, at the transfer step, after the electronic components have been transferred from the mounting head to the holding head, immediately electronic components already arranged on the flat stage are obtained by using the mounting nozzles and the mounting head; and whereby, thereafter, the viscous liquid on the flat stage is leveled by the squeegee, and then, the electronic components held by the holding head are arranged on the viscous liquid.

* * * * *